(12) United States Patent
Fukami

(10) Patent No.: US 9,921,474 B2
(45) Date of Patent: Mar. 20, 2018

(54) PATTERN-FORMING METHOD AND COMPOSITION

(71) Applicant: JSR CORPORATION, Tokyo (JP)

(72) Inventor: Kanako Fukami, Tokyo (JP)

(73) Assignee: JSR CORPORATION, Tokyo (JP)

( * ) Notice: Subject to any disclaimer, the term of this patent is extended or adjusted under 35 U.S.C. 154(b) by 11 days.

(21) Appl. No.: 14/641,677

(22) Filed: Mar. 9, 2015

(65) Prior Publication Data

US 2015/0253670 A1  Sep. 10, 2015

(30) Foreign Application Priority Data

Mar. 7, 2014  (JP) ................................. 2014-045755
Jan. 16, 2015  (JP) ................................. 2015-007296

(51) Int. Cl.
| | | |
|---|---|---|
| G03F 7/004 | (2006.01) |
| G03F 7/40 | (2006.01) |
| G03F 7/00 | (2006.01) |
| G03F 7/16 | (2006.01) |
| G03F 7/30 | (2006.01) |
| C09D 133/12 | (2006.01) |
| C08K 5/36 | (2006.01) |
| G03F 7/039 | (2006.01) |
| C09D 133/06 | (2006.01) |

(52) U.S. Cl.
CPC .............. *G03F 7/0035* (2013.01); *C08K 5/36* (2013.01); *C09D 133/12* (2013.01); *G03F 7/0397* (2013.01); *G03F 7/168* (2013.01); *G03F 7/30* (2013.01); *G03F 7/40* (2013.01); *C09D 133/06* (2013.01)

(58) Field of Classification Search
CPC ....... G03F 7/0035; G03F 7/40; G03F 7/70397
USPC ....................... 430/312, 330, 270.1, 905, 910
See application file for complete search history.

(56) References Cited

U.S. PATENT DOCUMENTS

| | | | |
|---|---|---|---|
| 4,910,122 A | 3/1990 | Arnold et al. | |
| 8,658,346 B2* | 2/2014 | Watanabe | C08F 220/60 430/312 |
| 8,877,429 B2* | 11/2014 | Wakamatsu | G03F 7/0035 430/312 |
| 8,927,200 B2* | 1/2015 | Meya | H01L 21/0274 430/315 |
| 2009/0053657 A1* | 2/2009 | Hatakeyama | C09D 133/066 430/324 |
| 2010/0190104 A1* | 7/2010 | Nakamura | G03F 7/0035 430/270.1 |
| 2010/0248167 A1* | 9/2010 | Konno | G03F 7/40 430/326 |
| 2010/0323292 A1* | 12/2010 | Nakamura | G03F 7/0035 430/270.1 |
| 2011/0033799 A1* | 2/2011 | Watanabe | C08F 220/60 430/270.1 |
| 2011/0111349 A1* | 5/2011 | Wakamatsu | G03F 7/0035 430/324 |
| 2011/0123936 A1* | 5/2011 | Hori | H01L 21/0273 430/324 |
| 2011/0223544 A1* | 9/2011 | Yada | G03F 7/0035 430/324 |
| 2012/0308930 A1* | 12/2012 | Hatakeyama | G03F 7/004 430/280.1 |
| 2013/0108960 A1* | 5/2013 | Hatakeyama | G03F 7/0395 430/280.1 |
| 2013/0337383 A1* | 12/2013 | Hatakeyama | G03F 7/004 430/285.1 |

FOREIGN PATENT DOCUMENTS

| | | |
|---|---|---|
| JP | 59-93448 A | 5/1984 |
| JP | 05-188598 A | 7/1993 |
| JP | 06-12452 B2 | 2/1994 |
| JP | 2005-352384 A | 12/2005 |
| JP | 2008-275995 A | 11/2008 |
| JP | 2008-310314 A | 12/2008 |
| JP | 4558064 B2 | 10/2010 |
| JP | 2013-083818 A | 5/2013 |
| JP | 2013-145290 A | 7/2013 |

\* cited by examiner

*Primary Examiner* — John S Chu
(74) *Attorney, Agent, or Firm* — Oblon, McClelland, Maier & Neustadt, L.L.P.

(57) ABSTRACT

A pattern-forming method includes forming a prepattern that is insoluble or hardly soluble in an organic solvent. A resin layer is provided on at least a lateral face of the prepattern. The prepattern and the resin layer are heated such that an adjacent portion of the resin layer to the prepattern is made insoluble or hardly soluble in the organic solvent, without being accompanied by an increase of a molecular weight of the prepattern and the resin layer. A portion of the resin layer other than the adjacent portion of the resin layer is removed. The resin layer is formed from a first composition including a first polymer and an organic solvent. Solubility of the first polymer in the organic solvent does not substantially change due to an action of an acid. A weight average molecular weight of the first polymer is 15,000-150,000.

25 Claims, 1 Drawing Sheet

PATTERN-FORMING METHOD AND COMPOSITION

CROSS-REFERENCE TO RELATED APPLICATIONS

The present application claims priority to Japanese Patent Application No. 2014-045755, filed Mar. 7, 2014, and to Japanese Patent Application No. 2015-007296, filed Jan. 16, 2015. The contents of these applications are incorporated herein by reference in their entirety.

BACKGROUND OF THE INVENTION

Field of Invention

The present invention relates to a pattern-forming method, and a composition.

Discussion of the Background

Miniaturization of various types of electronic device structures such as semiconductor devices and liquid crystal devices has been accompanied by demands for microfabrication of patterns in lithography processes. To meet such demands, a method in which a resist film formed using a resist material containing a polymer that changes in solubility in a developer solution due to an action of an acid, and a radiation-sensitive acid generator is exposed and developed to form a pattern, as well as a method in which further microfabrication is intended based on the formed pattern has been studied.

In connection with such a method, a technique has been known in which a formed pattern (prepattern) is subjected to a reaction with a crosslinking layer-forming material such that crosslinking of the resin constituting the pattern with the crosslinking layer-forming material is permitted to form an insoluble crosslinking layer (see Japanese Unexamined Patent Application, Publication No. 2008-310314). However, since this technique is accompanied by a crosslinking reaction, a disadvantage such as occurrence of defects, and the like may be raised. To the contrary, in connection with a method in which any reaction is not involved, a technique in which a prepattern is brought into contact with a water soluble resin composition containing: a water soluble vinyl resin; a compound having at least two amino groups in the molecule thereof; and a solvent so as to form an insolubilized layer through intermixing with the prepattern (see Japanese Unexamined Patent Application, Publication No. 2008-275995), as well as a technique in which a coating material containing a resin and a solvent is applied on a pattern to form a coating film, and thereafter the pattern is heated so as to narrow the pattern widths (see Japanese Unexamined Patent Application, Publication No. 2013-145290) has been studied.

SUMMARY OF THE INVENTION

According to one aspect of the present invention, a pattern-forming method includes forming a prepattern that is insoluble or hardly soluble in an organic solvent. A resin layer is provided on at least a lateral face of the prepattern. The prepattern and the resin layer are heated such that an adjacent portion of the resin layer to the prepattern is made insoluble or hardly soluble in the organic solvent, without being accompanied by an increase of a molecular weight of the prepattern and the resin layer. A portion of the resin layer other than the adjacent portion of the resin layer is removed with the organic solvent such that a resist pattern is obtained. The resin layer is formed from a first composition including a first polymer and an organic solvent. Solubility of the first polymer in the organic solvent does not substantially change due to an action of an acid. A weight average molecular weight of the first polymer is no less than 15,000 and no greater than 150,000.

According to another aspect of the present invention, a pattern-forming method includes forming a prepattern that is insoluble or hardly soluble in an organic solvent. A resin layer is provided on at least a lateral face of the prepattern. The prepattern and the resin layer are heated such that an adjacent portion of the resin layer to the prepattern is made insoluble or hardly soluble in the organic solvent, without being accompanied by an increase of a molecular weight of the prepattern and the resin layer. A portion of the resin layer other than the adjacent portion of the resin layer is removed with the organic solvent such that a resist pattern is obtained. The resin layer is formed from a first composition including a first polymer and an organic solvent. Solubility of the first polymer in the organic solvent does not substantially change due to an action of an acid. The first polymer includes a basic group; the first composition further includes a basic compound; or both thereof.

According to further aspect of the present invention, a composition for microfabrication of a resist pattern includes a polymer and an organic solvent. The polymer includes a basic group, and solubility of the polymer in an organic solvent does not substantially change due to an action of an acid.

According to further aspect of the present invention, a composition for microfabrication of a resist pattern includes a polymer, a basic compound, and an organic solvent. A solubility of the polymer in an organic solvent does not substantially change due to an action of an acid.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
FIGS. 1A to 1D show schematic views illustrating one embodiment of the pattern-forming method according to the present invention.

According to an embodiment of the invention, a pattern-forming method includes: forming a prepattern that is insoluble or hardly soluble in an organic solvent; providing a resin layer on at least a lateral face of the prepattern; heating the prepattern and the resin layer to make an adjacent portion of the resin layer to the prepattern insoluble or hardly soluble in the organic solvent, without being accompanied by an increase of a molecular weight; and removing with the organic solvent, a portion of the resin layer except for the adjacent portion made insoluble or hardly soluble wherein the resin layer is formed from a first composition (hereinafter, may be also referred to as "composition (I)") containing a first polymer not substantially accompanied by a change in solubility in the organic solvent due to an action of an acid (hereinafter, may be also referred to as "polymer (I)"), and an organic solvent, and wherein the weight average molecular weight of the first polymer is no less than 15,000 and no greater than 150,000.

According to another embodiment of the present invention, a pattern-forming method includes: forming a prepattern that is insoluble or hardly soluble in an organic solvent; providing a resin layer on at least a lateral face of the prepattern; heating the prepattern and the resin layer to make an adjacent portion of the resin layer to the prepattern insoluble or hardly soluble in the organic solvent, without being accompanied by an increase of a molecular weight; and removing with the organic solvent, a portion of the resin layer except for the adjacent portion made insoluble or hardly soluble, wherein the resin layer is formed from a first composition containing: a first polymer not substantially accompanied by a change in solubility in the organic solvent due to an action of an acid; and an organic solvent, and wherein at least one of the following features (i') and (ii') are attained:

(i') the first polymer having a basic group; and (ii') the first composition further containing a basic compound.

Moreover, still another embodiment of the present invention involves: a composition for use in microfabrication of a resist pattern (hereinafter, may be also referred to as "resist pattern-microfabricating composition") containing a polymer which has a basic group, and is not substantially accompanied by a change in solubility in an organic solvent due to an action of an acid, and an organic solvent; and a composition for use in microfabrication of a resist pattern containing a polymer not substantially accompanied by a change in solubility in an organic solvent due to an action of an acid, a basic compound and an organic solvent.

According to the pattern-forming method and the resist pattern-microfabricating composition of the embodiments of the present invention, a fine resist pattern having a desired dimension can be formed according to a convenient process, with less dependency on the pattern type (the degree of miniaturization does not vary so much depending on the dimension of the prepattern). Therefore, these can be suitably used for pattern formation in the filed of semiconductor processing and the like, in which further progress of miniaturization is expected in the future.

Hereinafter, embodiments of the present invention will be explained in detail.

Pattern-Forming Method

A pattern-forming method according to an embodiment of the present invention will be explained below with reference to FIG. 1.

The pattern-forming method includes: a prepattern-forming step, a resin layer-providing step, an insolubilizing step (i.e., step of making insoluble or hardly soluble), and a removing step. It is preferred that the pattern-forming method further includes after the prepattern-forming step and before the resin layer-providing step, a step of bringing a second composition not containing a polymer not substantially accompanied by a change in solubility in the organic solvent due to an action of an acid, but containing a basic compound and an organic solvent (hereinafter, may be also referred to as "composition (II)") into contact with at least a lateral face of the prepattern (hereinafter, may be also referred to as "contacting step"). It is preferred that the pattern-forming method further includes after the removing step, a step of rinsing with an organic solvent that is different from the organic solvent used in the removing step (hereinafter, may be also referred to as "rinsing step"). Each step will be explained below.

Prepattern-Forming Step

In this step, a prepattern that is insoluble or hardly soluble in an organic solvent is formed. According to this step, a prepattern 2 is formed on a substrate 1 as shown in FIG. 1A. The expression "insoluble or hardly soluble in an organic solvent" means exhibiting low solubility in an organic solvent to an extent that the shape of the prepattern is substantially maintained. The prepattern is constituted from, for example, a substance capable of intermixing with the polymer (I) constituting the resin layer by heating, as described later.

The organic solvent is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialiphatic ethers such as diethyl ether, dipropyl ether and dibutyl ether;

diaromatic ethers such as diphenyl ether and ditolyl ether;

aromatic aliphatic ethers such as anisole and phenylethyl ether; and the like.

Examples of the ketone solvent include:

aliphatic ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone, trimethylnonanone, cyclopentanone, cyclohexanone, cycloheptanone, cyclooctanone, methylcyclohexanone, 2,4-pentanedione, acetonylacetone and acetophenone;

aliphatic aromatic ketone solvents such as acetophenone, propiophenone and tolylmethyl ketone;

aromatic ketone solvents such as benzophenone, tolylphenyl ketone and ditolyl ketone; and the like.

Examples of the amide solvent include:

NAN'-dimethylimidazolidinone, N-methylformamide, NAN-dimethylformamide, NAN-diethylformamide, acetamide, N-methylacetamide, NAN-dimethylacetamide, N-methylpropionamide, N-methylpyrrolidone, and the like.

Examples of the ester solvent include:

mono ester solvents such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, methoxy triglycol acetate, ethyl propionate, n-butyl propionate, iso-amyl propionate, methyl lactate, ethyl lactate, n-butyl lactate and n-amyl lactate;

diester solvents such as glycol diacetate, diethyl oxalate, di-n-butyl oxalate, diethyl malonate, dimethyl phthalate and diethyl phthalate;

polyhydric alcohol mono ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and γ-valerolactone;

carbonate solvents such as diethyl carbonate, dipropylcarbonate, ethylene carbonate and propylene carbonate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ether solvent, the ketone solvent and the ester solvent are preferred. The ether solvent is more preferably an aromatic aliphatic ether solvent, and particularly preferably anisole. The ketone solvent is more preferably an aliphatic ketone solvent, and particularly preferably 2-heptanone and cyclohexanone. The ester solvent is more preferably a mono ester solvent and a polyhydric alcohol mono ether acetate solvent, and particularly preferably butyl acetate and propylene glycol monomethyl ether acetate. Two or more types of these organic solvents may be used in combination.

The prepattern-forming step preferably includes: a step of providing a resist film (hereinafter, may be also referred to as "resist film-providing step") using a resist composition containing a second polymer that is accompanied by a decrease in solubility in the organic solvent due to an action of an acid (hereinafter, may be also referred to as "(a) polymer" or "polymer (a)"), radiation-sensitive acid generator (hereinafter, may be also referred to as"(b) acid generator" or "acid generator (b)") and solvent (hereinafter, may be also referred to as "(c) solvent" or "solvent (c)"); a step of exposing the resist film (hereinafter, may be also referred to as "exposing step"); and a step of developing the resist film exposed above (hereinafter, may be also referred to as "development step") using a developer solution containing the organic solvent. Through forming the prepattern according to the method including each step described above, intermixing of the polymer constituting the prepattern with the polymer constituting the resin layer is likely to occur as described later, and as a result, the pattern formation can be more effectively carried out. Each step will be explained below.

Resist Film-Providing Step

In this step, the resist film is provided using the resist composition containing the polymer (a), the acid generator (b) and the solvent (c). This resist composition will be described later.

The substrate on which the resist film is provided may be exemplified by conventionally well-known substrates such as a silicon wafer, a wafer coated with silicon dioxide or aluminum, and the like. Also, an organic or inorganic antireflective film disclosed in, for example, Japanese Examined Patent Application, Publication Nos. H6-12452, S59-93448 and the like may be provided on the substrate. The coating process of the resist composition is exemplified by the process of spin-coating, cast coating, roll coating, and the like. After the coating soft baking (PB) may be also carried out as needed, for volatilizing the solvent in the coating film. The lower limit of the temperature of PB is typically 60° C., and preferably 80° C. The upper limit of the temperature of PB is typically 140° C., and preferably 120° C. The lower limit of the time period of PB is typically 5 sec, and preferably 10 sec. The upper limit of the time period of PB is typically 600 sec, and preferably 300 sec. The lower limit of the average film thickness of the resist film formed is preferably 10 nm, and more preferably 20 nm. The upper limit of the average film thickness is preferably 1,000 nm, and more preferably 500 nm.

In order to prevent influences of basic impurities etc., included in the environmental atmosphere, a protective film disclosed in, for example, Japanese Unexamined Patent Application, Publication No. H5-188598 and the like, may be also provided on the resist film. Furthermore, in order to prevent outflow of the acid generator and the like from the resist film, a protective film for liquid immersion disclosed in, for example, Japanese Unexamined Patent Application, Publication No. 2005-352384 and the like, may be provided on the resist film. It is to be noted that these techniques may be used in combination.

Exposing Step

In this step, the resist film provided in the resist film-providing step is exposed. The exposure is carried out by irradiating with a radioactive ray through a photomask (as the case may be, through a liquid immersion medium such as water). The radioactive ray is exemplified by electromagnetic waves such as visible light rays, ultraviolet rays, far ultraviolet rays, X-rays and γ-rays; charged particle rays such as electron beams and α-rays, and the like, which may be selected depending on the line width of the pattern intended. Of these, far ultraviolet rays and electron beams are preferred, and an ArF excimer laser beam (wavelength: 193 nm), a KrF excimer laser beam (wavelength: 248 nm) and electron beams are more preferred, and an ArF excimer laser beam and electron beams are still more preferred.

The exposure process may be appropriately selected in accordance with the shape and the like of the resist pattern desired. For example, an isolated trench (iso-trench) pattern can be formed by exposing a desired region through a mask having an isolated line (iso-line) pattern. Also, the exposure may be carried out at least twice. When the exposure is carried out at least twice, the exposure is preferably carried out successively. When the exposure is carried out a plurality of times, for example, first exposure is carried out through a line-and-space pattern mask at a desired region, and subsequently second exposure is carried out such that lines cross over light-exposed sites subjected to the first exposure (first light-exposed sites) to form second light-exposed sites. The first light-exposed sites are preferably orthogonal to the second light-exposed sites. Due to the first light-exposed sites and the second light-exposed sites being orthogonal with each other, a circular contact hole pattern can be readily formed at light-unexposed sites surrounded by these light-exposed sites.

When the exposure is carried out in liquid immersion lithography, examples of the immersion liquid employed include water, a fluorine-containing inert liquid, and the like. It is preferred that the immersion liquid be transparent to the exposure wavelength, and has a temperature coefficient of the refractive index as small as possible so that distortion of an optical image projected onto the film is minimized. When using an ArF excimer laser (wavelength: 193 nm) as the exposure light source, it is preferred to use water from the viewpoint of availability and ease of handling, in addition to the viewpoints described above. When water is used, a marginal amount of an additive which reduces the surface tension of water and imparts enhanced surfactant power may be added. It is preferred that the additive hardly dissolves a resist film on a wafer and has a negligible influence on an optical coating of an inferior face of a lens. The water for use is preferably distilled water.

After the exposure as described above, it is preferred that post exposure baking (PEB) is carried out so as to facilitate a dissociation of the acid-labile group included in the polymer (a) and the like by way of the acid generated from the acid generator (b) through the exposure at exposed sites of the resist film. This PEB allows the difference in solubility in a developer solution to be produced between the light-exposed sites and the light-unexposed sites. The lower limit of the temperature of PEB is typically 50° C., and preferably 80° C. The upper limit of the temperature of PEB is typically 180° C., and preferably 130° C. The lower limit of the time period of PEB is typically 5 sec, and preferably 10 sec. The upper limit of the time period of PEB is typically 600 sec, and preferably 300 sec.

Development Step

In this step, the resist film exposed as described above is developed with a developer solution containing the organic solvent. Thus, a predetermined resist pattern is formed. After the development, washing with a rinse agent such as water or alcohol, and drying are generally conducted.

Examples of the organic solvent contained in the developer solution include solvents similar to those exemplified as the organic solvent for use in the above prepattern-forming step, and the like. Of these, ether solvents, ester solvents and ketone solvents are preferred. The ether solvent is preferably an aromatic ring-containing ether solvent, and more preferably anisole. The ester solvent is preferably an acetic acid ester solvent, and more preferably n-butyl acetate. The ketone solvent is preferably a linear ketone solvent, and preferably 2-heptanone.

The lower limit of the content of the organic solvent in the developer solution is preferably 80% by mass, more preferably 90% by mass, still more preferably 95% by mass, and particularly preferably 99% by mass. When the content of the organic solvent in the developer solution falls within the above range, the contrast between the light-exposed sites and the light-unexposed sites can be improved. It is to be noted that components other than the organic solvent are exemplified by water, silicone oil, and the like.

A surfactant may be added to the developer solution in an appropriate amount as needed. As the surfactant, for example, an ionic or nonionic fluorochemical surfactant and/or a silicone surfactant may be used.

Examples of the development process include: a dipping process in which the substrate is immersed in a container filled with the developer solution for a given time; a puddling process that allows the developer solution to be present on the surface of the substrate by way of surface tension for a given time; a spraying process in which the developer solution is sprayed onto the surface of the substrate; a dynamic dispensing process in which the developer solution is continuously applied to the substrate that is rotated at a constant speed while scanning with a nozzle for application of the developer solution at a constant speed; and the like.

It is preferred that the resist film after the development is rinsed with a rinse agent. An organic solvent may be used as the rinse agent, whereby scum generated can be efficiently washed away. The rinse agent is, for example, a hydrocarbon solvent, a ketone solvent, an ester solvent, an alcohol solvent, an amide solvent, or the like. Among these, an alcohol solvent and an ester solvent are preferred, and a monovalent alcohol solvent having 6 to 8 carbon atoms is more preferred. The monovalent alcohol having 6 to 8 carbon atoms is exemplified by linear, branched or cyclic monovalent alcohols, and examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol and 4-methyl-2-pentanol are preferred, and 4-methyl-2-pentanol is more preferred.

Each component of the rinse agent may be used either alone, or in combination of two or more thereof. The upper limit of the moisture content of the rinse agent is preferably 10% by mass, more preferably 5% by mass, and still more preferably 3% by mass. When the moisture content falls within the above-specified range, favorable development characteristics can be attained. It is to be noted that surfactant may be also added to the rinse agent.

Examples of the rinsing process include: a spinning process in which the rinse agent is applied to the substrate that is rotated at a constant speed; a dipping process that in which the substrate is immersed in a container filled with the rinse agent for a given time; a spraying process in which the rinse agent is sprayed onto the surface of the substrate, and the like.

Exemplary prepattern formed in this step is a line-and-space pattern, a hole pattern, and the like.

The resist composition for use in forming the prepattern will be explained below.

Resist Composition

The resist composition contains the polymer (a), the acid generator (b) and the solvent (c). In addition to the components (a) to (c), the resist composition may contain (d) a polymer having a percentage content of fluorine atoms greater than that of the polymer (a) (hereinafter, may be also referred to as "(d) polymer" or "polymer (d)"), and (e) an acid diffusion controller. Furthermore, other component(s) except for the foregoing may be also contained. Each component will be explained below.

(a) Polymer

The polymer (a) is accompanied by a decrease in solubility in the organic solvent due to an action of an acid. The polymer (a) is not particularly limited as long as the above property is exhibited, and is exemplified by a polymer having an acid-labile group (hereinafter, may be also referred to as "(a') polymer" or "polymer (a')"), and the like. The "acid-labile group" means a group that substitutes for a hydrogen atom in an acidic group such as a carboxyl group or a hydroxy group, and is dissociated by an action of an acid. When the polymer (a') is employed as the polymer (a), a pattern having a more favorable shape can be formed according to the pattern-forming method.

Structural Unit (I)

It is preferred that the polymer (a') has a structural unit that includes an acid-labile group (hereinafter, may be also referred to as "structural unit (I)"). The structural unit (I) is exemplified by a structural unit represented by the following formula (1), and the like.

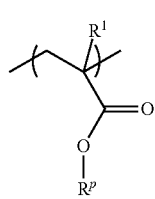

(1)

In the above formula (1), $R^1$ represents a hydrogen atom, a fluorine atom, a methyl group or a trifluoromethyl group; and $R^p$ represents a monovalent acid-labile group.

The monovalent acid-labile group represented by $R^p$ is preferably a group represented by the following formula (i).

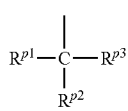

(i)

In the above formula (i), $R^{p1}$ represents a monovalent hydrocarbon group having 1 to 20 carbon atoms; $R^{p2}$ and $R^{p3}$ each independently represent a monovalent linear hydrocarbon group having 1 to 20 carbon atoms or a monovalent alicyclic hydrocarbon having 3 to 20 carbon atoms, or these groups taken together represent an alicyclic structure having 3 to 20 ring atoms together with the carbon atom to which these bond.

The monovalent hydrocarbon group having 1 to 20 carbon atoms represented by $R^{p1}$ is exemplified by a monovalent linear hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent linear hydrocarbon group having 1 to 20 carbon atoms which may be represented by $R^{p1}$, $R^{p2}$ and $R^{p3}$ include a methyl group, an ethyl group, a n-propyl group, an i-propyl group, a n-butyl group, a 2-methylpropyl group, a 1-methylpropyl group, a t-butyl group, and the like.

Examples of the monovalent alicyclic hydrocarbon group having 3 to 20 carbon atoms which may be represented by $R^{p1}$, $R^{p2}$ and $R^{p3}$ include:

cycloalkyl groups such as a cyclopropyl group, a cyclobutyl group, a cyclopentyl group, a cyclohexyl group, a cycloheptyl group, a cyclooctyl group, a cyclodecyl group, a cyclododecyl group, a norbornyl group, an adamantyl group, a tricyclodecyl group and a tetracyclododecyl group;

cycloalkenyl groups such as a cyclopropenyl group, a cyclobutenyl group, a cyclopentenyl group, a cyclohexenyl group, a cyclooctenyl group, a cyclodecenyl group, a norbornenyl group, a tricyclodecenyl group and a tetracyclododecenyl group; and the like.

Examples of the monovalent aromatic hydrocarbon group having 6 to 20 carbon atoms which may be represented by $R^{p1}$, $R^{p2}$ and $R^{p3}$ include:

aryl groups such as a phenyl group, a tolyl group, a xylyl group, a naphthyl group and an anthryl group;

aralkyl groups such as a benzyl group, a phenethyl group and a naphthylmethyl group; and the like.

Of these, it is preferred that $R^{p1}$ represents a monovalent linear hydrocarbon group having 1 to 10 carbon atoms, and the groups represented by $R^{p2}$ and $R^{p3}$ taken together represent an adamantane structure or a cycloalkane structure together with the carbon atom to which these groups bond.

Examples of the structural unit (I) include structural units represented by the following formulae (1-1) to (1-4) (hereinafter, may be also referred to as "structural units (I-1) to (I-4)"), and the like.

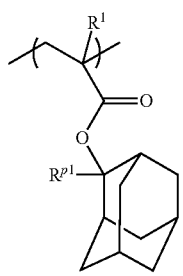

(1-1)

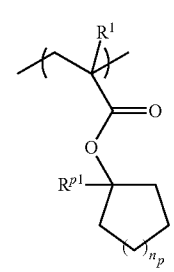

(1-2)

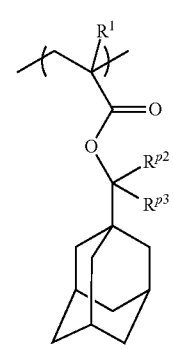

(1-3)

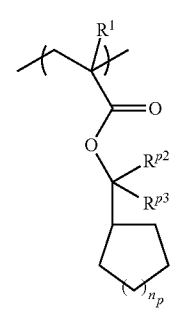

(1-4)

In the above formulae (1-1) to (1-4), $R^1$ is as defined in the above formula (1); $R^{p1}$, $R^{p2}$ and $R^{p3}$ are as defined in the above formula (i); and $n_p$ is an integer of 1 to 4.

The structural unit represented by the above formula (1) or (1-1) to (1-4) is exemplified by structural units represented by the following formulae.

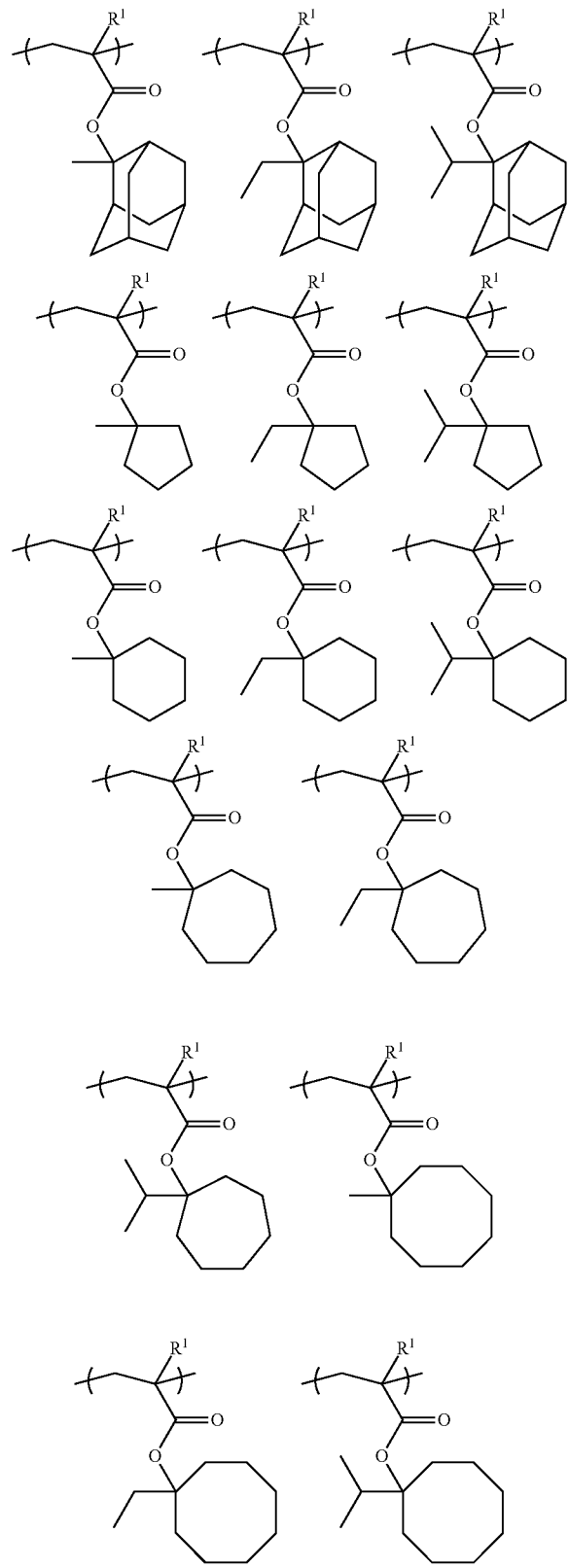

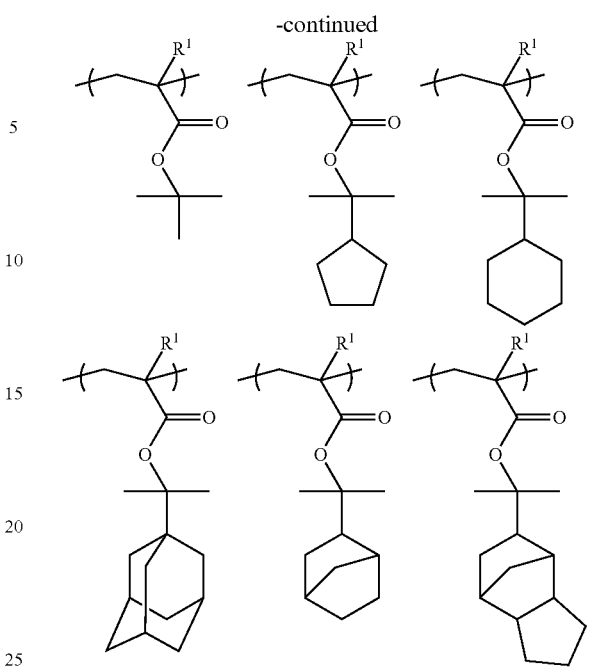

In the above formulae, $R^1$ is as defined in the above formula (1).

Examples of the monomer which gives the structural unit (I) include preferably (meth)acrylic acid 2-methyladamantan-2-yl ester, (meth)acrylic acid 2-ethyladamantyl-2-yl ester, (meth)acrylic acid 2-methylbicyclo[2.2.1]hept-2-yl ester, (meth)acrylic acid 2-ethylbicyclo[2.2.1]hept-2-yl ester, (meth)acrylic acid 1-(bicyclo[2.2.1]hept-2-yl)-1-methylethyl ester, (meth)acrylic acid 1-(adamantan-1-yl)-1-methylethyl ester, (meth)acrylic acid 1-methyl-1-cyclopentyl ester, (meth)acrylic acid 1-ethyl-1-cyclopentyl ester, (meth)acrylic acid 1-methyl-1-cyclohexyl ester, (meth)acrylic acid 1-ethyl-1-cyclohexyl ester, and the like.

The structural unit (I) is preferably the structural unit (I-1) and the structural unit (I-2), more preferably a structural unit derived from 1-alkylcyclopentan-1-yl (meth)acrylate and a structural unit derived from 2-alkyladamantan-2-yl (meth)acrylate, and still more preferably a structural unit derived from 1-methylcyclopentan-1-yl (meth)acrylate and a structural unit derived from 2-ethyladamantan-1-yl (meth)acrylate.

The lower limit of the proportion of the structural unit (I) contained with respect to the total structural units constituting the polymer (a) is preferably 30 mol %, and more preferably 35 mol %. The upper limit of the proportion is preferably 70 mol %, and more preferably 65 mol %. When the proportion of the structural unit (I) contained falls within the above range, a resist pattern having a more favorable shape can be formed according to the pattern-forming method.

The polymer (a) preferably has a structural unit (II) that includes a lactone structure, a cyclic carbonate structure, a sultone structure or a combination thereof, or may have a structural unit (III) that includes a hydrophilic functional group, or other structural unit except for the structural units described above.

Structural Unit (II)

The structural unit (II) includes a lactone structure, a cyclic carbonate structure, a sultone structure or a combination thereof. When the polymer (a) has the structural unit (II), adhesiveness of the prepattern to the substrate is improved, and consequently a pattern having a more favorable shape can be formed according to the pattern-forming method. Examples of the structural unit (II) include structural units represented by the following formulae, and the like.
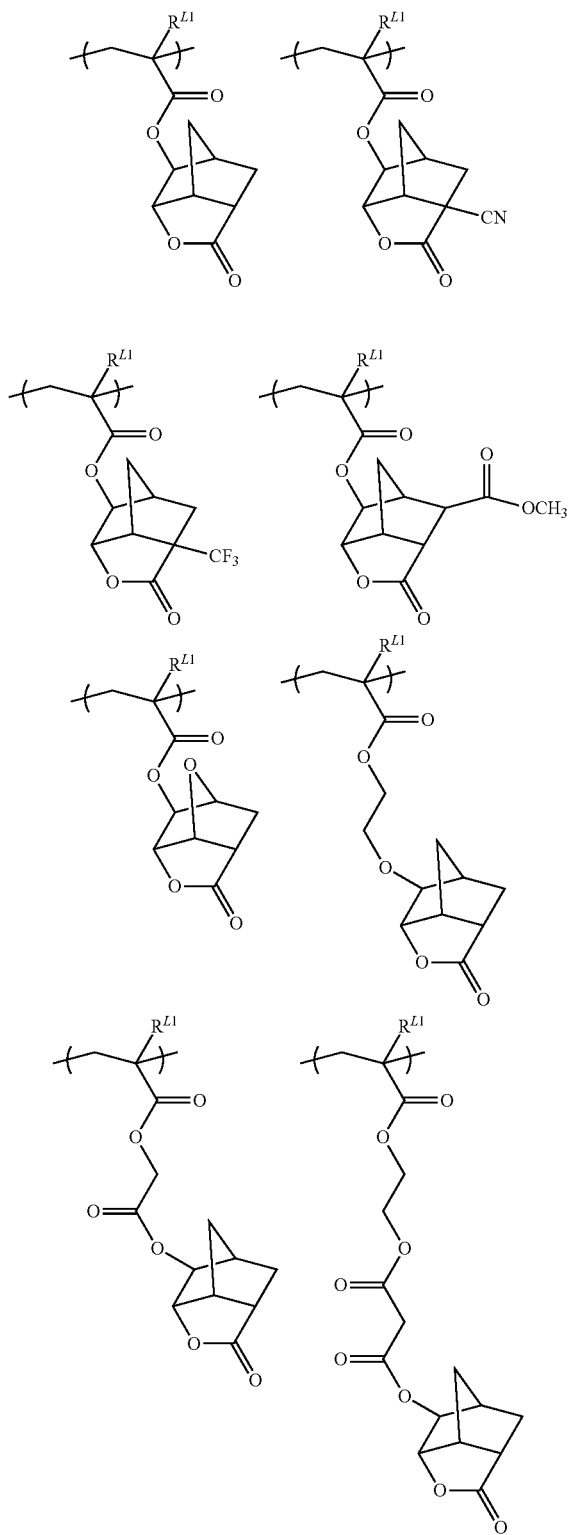
-continued
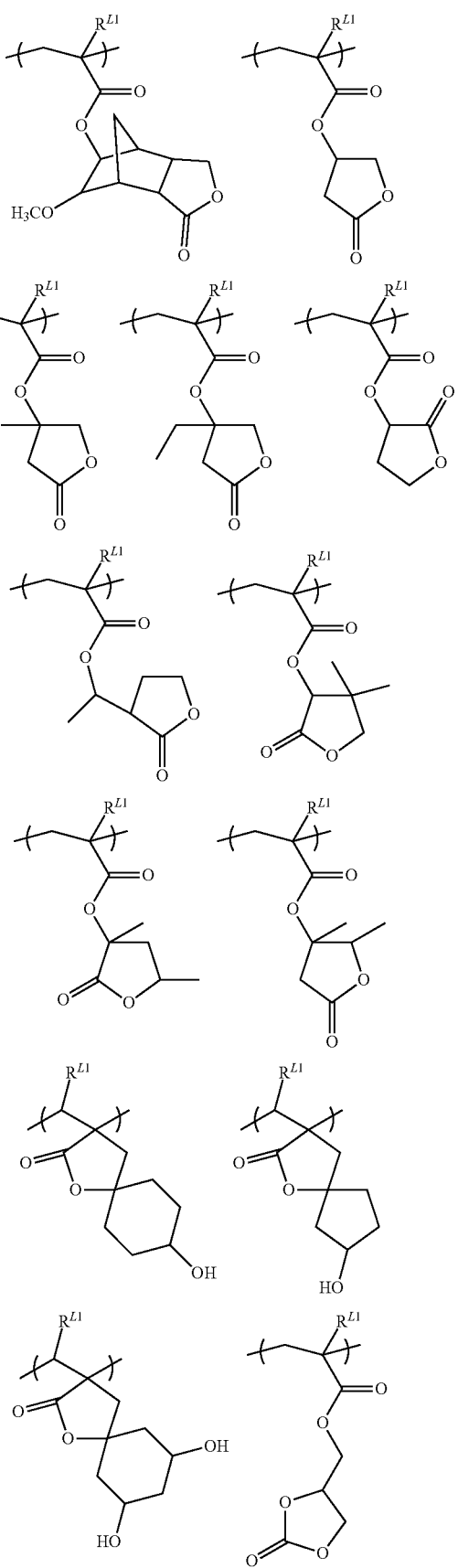

-continued
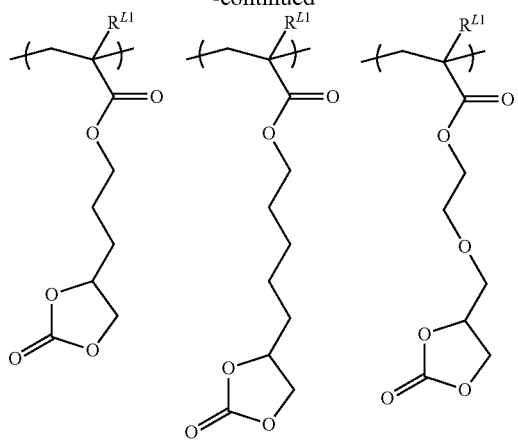
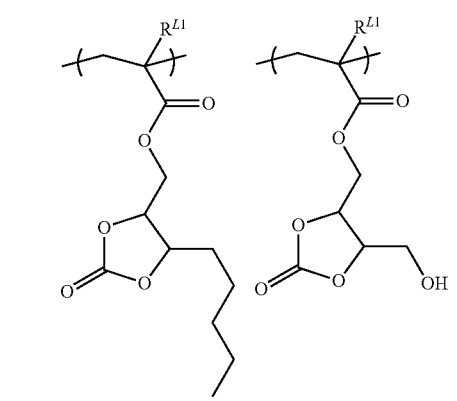
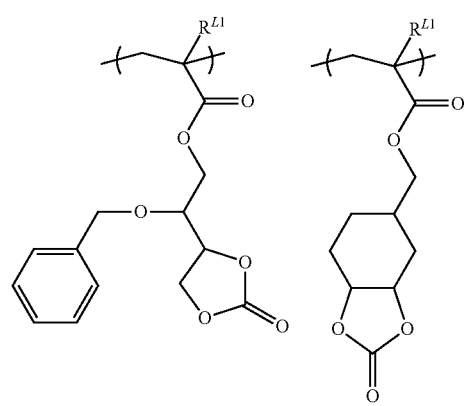
-continued
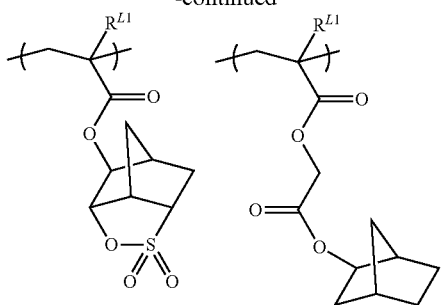
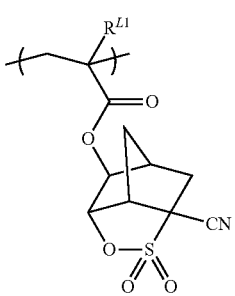
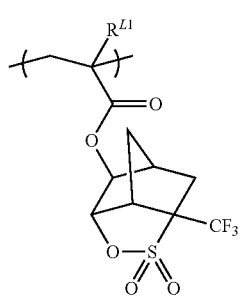
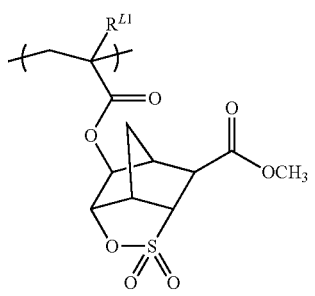
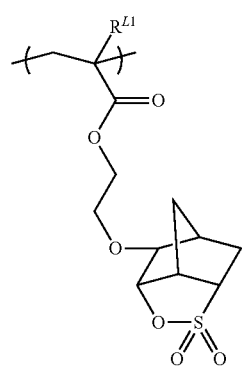
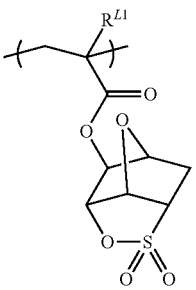
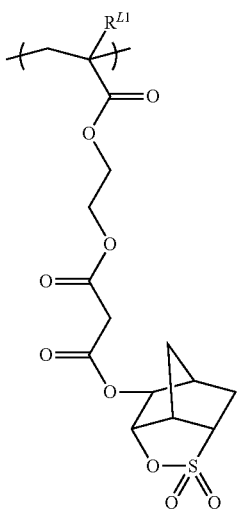

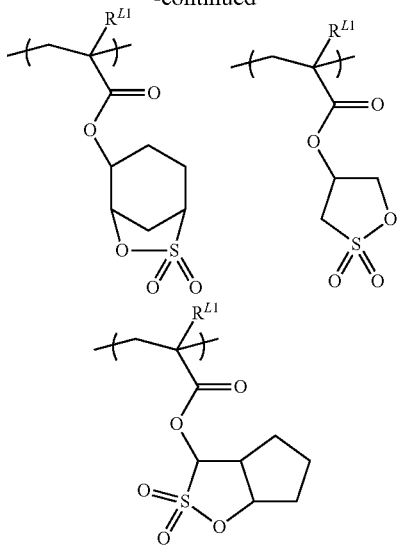

In the above formulae, $R^{L1}$ represents a hydrogen atom, a fluorine atom, a methyl group or a trifluoromethyl group.

Of these, the structural unit (II) preferably includes a lactone structure, more preferably includes a polycyclic lactone structure, and still more preferably includes a norbornanelactone structure. Furthermore, a structural unit derived from norbornanelactone-yl (meth)acrylate is particularly preferred.

The lower limit of the proportion of the structural unit (II) contained with respect to the total structural units constituting the polymer (a) is preferably 30 mol %, and more preferably 35 mol %. The upper limit of the proportion is preferably 70 mol %, more preferably 60 mol %, and still more preferably 50 mol %. When the proportion of structural unit (II) contained falls within the above range, a pattern having an even more favorable shape can be formed according to the pattern-forming method.

Structural Unit (III)

The structural unit (III) includes a hydrophilic functional group. When the polymer (a) has the structural unit (III), adhesiveness of the prepattern to the substrate is improved, and consequently a pattern having a more favorable shape can be formed according to the pattern-forming method.

The hydrophilic functional group is exemplified by a hydroxy group, a carboxy group, an amino group, an oxo group (=O), a sulfonamide group, a cyano group, a nitro group, and the like. Of these, a hydroxy group is preferred.

Examples of the structural unit (III) include structural units represented by the following formulae, and the like.

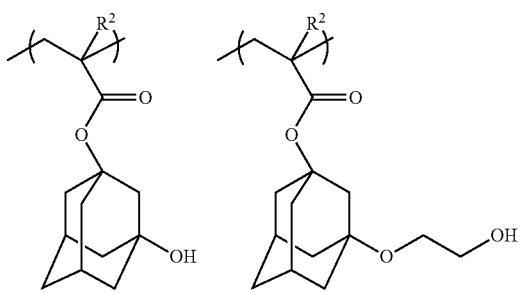

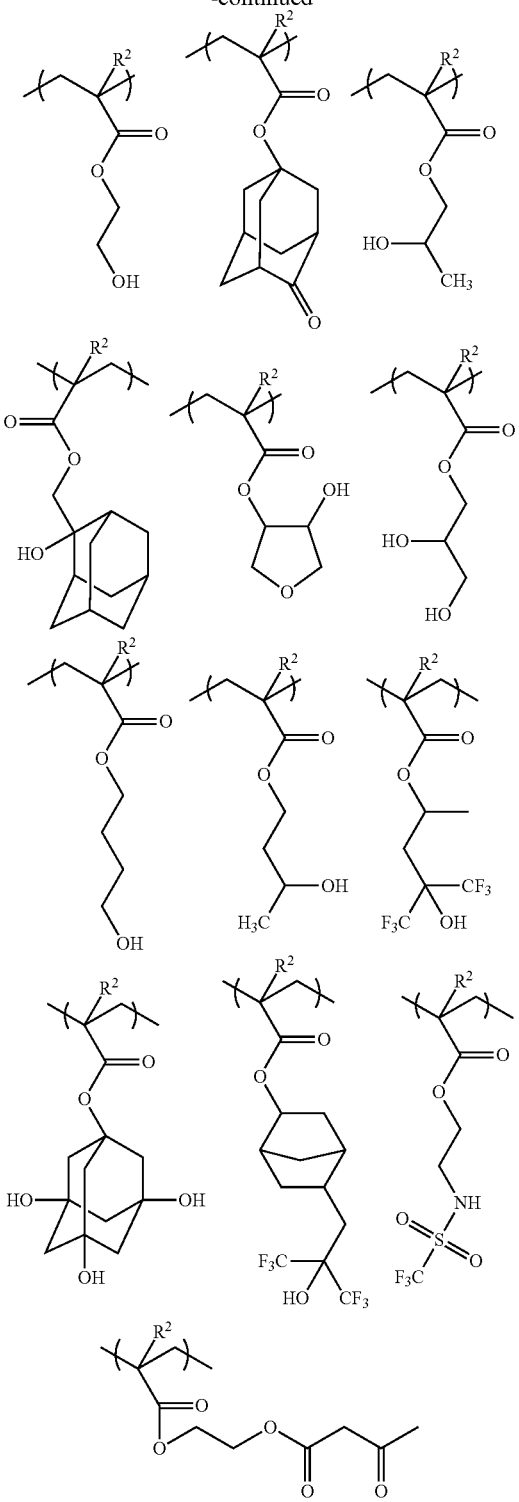

In the above formulae, $R^2$ represents a hydrogen atom, a fluorine atom, a methyl group or a trifluoromethyl group.

Of these, the structural unit (III) preferably includes a hydroxy group, more preferably includes a hydroxy group and a polycyclic cycloalkane structure, and still more preferably includes a hydroxy group and an adamantane structure. Furthermore, a structural unit derived from 3-hydroxyadamantan-1-yl (meth)acrylate is particularly preferred.

When the polymer (a) includes the structural unit (III), the lower limit of the proportion of the structural unit (III) contained with respect to the total structural units constituting the polymer (a) is preferably 5 mol %, and more preferably 10 mol %. The upper limit of the proportion is preferably 40 mol %, more preferably 30 mol %, and still more preferably 20 mol %. When the proportion of structural unit (III) contained falls within the above range, a resist pattern having an even more favorable shape can be formed according to the pattern-forming method.

The polymer (a) may include other structural unit except for the structural units described above. The other structural unit is exemplified by a structural unit that includes an acid-nonlabile hydrocarbon group having 1 to 30 carbon atoms, and the like. The "acid-nonlabile group" as referred to means a group that is not dissociated from the atom to which the group bonds, due to an action of an acid, and examples of the acid-nonlabile group include: groups that bind to an oxygen atom of a carboxy group, a hydroxy group or the like and are not dissociated due to an action of an acid; groups that bind to a carbon atom of a main chain of a polymer and are not dissociated due to an action of an acid, and the like.

Examples of the acid-nonlabile hydrocarbon group having 1 to 30 carbon atoms include acid-nonlabile linear hydrocarbon groups having 1 to 30 carbon atoms, acid-nonlabile alicyclic hydrocarbon groups having 3 to 30 carbon atoms, acid-nonlabile aromatic hydrocarbon groups having 6 to 30 carbon atoms, and the like.

Examples of the acid-nonlabile linear hydrocarbon group having 1 to 30 carbon atoms include alkyl groups such as a methyl group, an ethyl group, a propyl group, a butyl group, a pentyl group, a hexyl group, and the like.

Examples of the acid-nonlabile alicyclic hydrocarbon group having 3 to 30 carbon atoms include:

monocyclic cycloalkyl groups such as a cyclopropyl group, a cyclobutyl group, a cyclopentyl group, a cyclohexyl group, a cyclopentyl group, a cyclooctyl group, a cyclodecyl group and a cyclododecyl group;

polycyclic cycloalkyl groups such as a norbornyl group, an adamantyl group, a tricyclodecyl group and a tetracyclododecyl group; and the like.

Examples of the acid-nonlabile aromatic hydrocarbon group having 6 to 30 carbon atoms include aryl groups such as a phenyl group, a naphthyl group and an anthryl group;

aralkyl groups such as a benzyl group, a phenethyl group and a naphthylmethyl group; and the like.

The other structural unit is preferably a structural unit derived from a (meth)acrylic acid ester having the acid-nonlabile hydrocarbon group, as well as a structural unit derived from benzyl (meth)acrylate, phenyl (meth)acrylate, naphthyl (meth)acrylate, naphthylmethyl (meth)acrylate or styrene. It is preferred that a polar group does not bond to the aromatic ring. As a result of the absence of the polar group bonding to the aromatic ring, etching resistance of the resist pattern can be further improved. Examples of the polar group include a hydroxy group, an amino group, a sulfanyl group, and the like.

The upper limit of the proportion of the other structural unit contained with respect to the total structural units constituting the polymer (a) is preferably 30 mol %, and more preferably 20 mol %.

The lower limit of the polymer (a) in the total solid contents of the resist composition, preferably 70% by mass, more preferably 80% by mass, and still more preferably 85% by mass.

Synthesis Method of Polymer (a)

The polymer (a) may be synthesized by, for example, polymerizing monomers that give each structural unit using a radical polymerization initiator in an appropriate solvent.

Examples of the radical polymerization initiator include: azo radical initiators such as 2,2'-azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobisisobutyrate are preferred. These radical initiators may be used as a mixture of two or more types thereof.

Examples of the solvent which may be used in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, diethoxyethanes and diethoxyethanes;

alcohols such as methanol, ethanol, 1-propanol, 2-propanol and 4-methyl-2-pentanol, and the like. These solvents may be used either one type alone, or in combination of or two or more types thereof.

The lower limit of the reaction temperature in the polymerization is typically 40° C., and preferably 50° C. The upper limit of the reaction temperature in the polymerization is typically 150° C., and preferably 120° C. The lower limit of the time period of the reaction in the polymerization is typically 1 hour, and preferably 2 hours. The upper limit of the time period of the reaction is typically 48 hours, and preferably 24 hours.

The lower limit of the weight average molecular weight (Mw) of the polymer (a) as determined by gel permeation chromatography (GPC) is preferably 1,000, more preferably 2,000, and still more preferably 3,000. The upper limit of the Mw is preferably 100,000, more preferably 50,000, and still more preferably 30,000. When the Mw of the polymer (a) falls within the above range, a pattern having an even more favorable shape can be formed according to the pattern-forming method.

The lower limit of the ratio (Mw/Mn) of the Mw to the number average molecular weight (Mn) of the polymer (a) is typically 1, and preferably 1.1. The upper limit of the ratio is typically 3, and preferably 2.

The Mw and the Mn of the polymer are values determined with GPC using GPC columns available from Tosoh Corporation ("G2000 HXL"×2, "G3000 HXL"×1, and "G4000 HXL"×1) under the following conditions:

eluent: tetrahydrofuran (Wako Pure Chemical Industries, Ltd.)

flow rate: 1.0 mL/min sample concentration: 1.0% by mass amount of injected sample: 100 μL detector: differential refractometer standard substance: mono-dispersed polystyrene (b) Acid Generator The acid generator (b) is a substance that generates an acid upon an exposure. The polymer (a) decreases the solubility thereof in an organic solvent due to an action of an acid generated from the acid generator (b), through e.g., allowing the acid-labile group of the polymer (a) to be dissociated. As a result, a prepattern that is insoluble or hardly soluble in an organic solvent can be formed. The acid generator (b) contained in the resist composition may be either in the form of a low-molecular compound as described later (hereinafter, may be also referred to as "acid generating agent (b)" ad libitum), or in the form incorporated into the polymer, or may be in both of these forms.

The acid generating agent (b) is exemplified by an onium salt compound, an N-sulfonyloxyimide compound, and the like.

The onium salt compound is exemplified by a sulfonium salt, a tetrahydrothiophenium salt, an iodonium salt, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-bicyclo[2.2.1]hept-2-yl-1,1-difluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxyl)hexane-1-sulfonate, triphenylsulfonium 2-(1-adamantyl)-1,1-difluoroethanesulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,2,2-tetrafluoroethanesulfonate, 1-(3,5-dimethyl-4-hydroxyphenyl)tetrahydrothiophenium camphorsulfonate, and the like.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide, and the like.

The acid generating agent (b) is preferably an onium salt compound, and more preferably a sulfonium salt. One type, or two or more types of the acid generating agent (b) may be used.

When the acid generator (b) is the acid generating agent (b), the lower limit of the content of the acid generating agent (b) with respect to 100 parts by mass of the polymer (a) is typically 0.1 parts by mass, and preferably 0.5 parts by mass. The upper limit of the content is typically 20 parts by mass, and preferably 15 parts by mass. When the content of the acid generating agent (b) is less than the lower limit described above, sensitivity and developability of the resist composition may be deteriorated. On the other hand, when the content of the acid generating agent (b) is greater than the upper limit described above, transparency to the radioactive ray may be impaired, whereby obtaining a desired resist pattern may be difficult.

(c) Solvent

The solvent (c) is not particularly limited as long as the polymer (a), the acid generator (b) and other component(s) can be dissolved or dispersed.

Examples of the solvent (c) include solvents similar to those exemplified as the organic solvent for use in the prepattern-forming step, and the like.

Of these, the solvent (c) is preferably an ester solvent and a ketone solvent. The ester solvent is preferably a polyhydric alcohol mono ether acetate solvent and a lactone solvent, and more preferably propylene glycol monomethyl ether acetate and μ-butyrolactone. The ketone solvent is preferably a cyclic ketone solvent, and more preferably cyclohexanone.

(d) Polymer

The polymer (d) has a percentage content of fluorine atoms higher than the percentage content of fluorine atoms of the polymer (a). When the resist contains the polymer (d), in forming the resist film, the polymer (d) tends to be unevenly distributed in the surface layer of the resist film due to oil repellent characteristic feature of the polymer (d). As a consequence, containing the polymer (d) is preferred since elution of an acid generating agent, an acid diffusion control agent and the like into a liquid immersion medium can be prevented in a case where liquid immersion lithography is carried out. In addition, owing to a water repellent feature of the polymer (d), an advancing contact angle of a liquid immersion medium on a resist film can be controlled to fall within a desired range, whereby formation of bubble defects can be suppressed. Furthermore, a higher receding contact angle of a liquid immersion medium on a resist film is attained, thereby enabling exposure by high-speed scanning without remaining water droplets. It is to be noted that the percentage content of fluorine atoms (% by mass) may be calculated through a determination of the structure of the polymer by a measurement on $^{13}$C-NMR, $^1$H-NMR, IR spectrum or the like.

The polymer (d) is not particularly limited as long as the percentage content of fluorine atoms is greater than that of the polymer (a), and preferably has a fluorinated alkyl group. The polymer (d) is prepared by a polymerization using one or more types of monomers that include a fluorine atom in the structure thereof. The monomers that include a fluorine atom in the structure thereof are exemplified by a monomer that includes a fluorine atom in the main chain thereof, a monomer that includes a fluorine atom in a side chain thereof, and a monomer that includes a fluorine atom in the main chain thereof and side chain.

Examples of the monomer that includes a fluorine atom in the main chain thereof include α-fluoroacrylate compounds, α-trifluoromethylacrylate compounds, β-fluoroacrylate compounds, β-trifluoromethylacrylate compounds, α,β-fluoroacrylate compounds, α,β-trifluoromethylacrylate compounds, compounds derived by substituting hydrogen atom(s) of one or more types of vinyl moieties by a fluorine atom, a trifluoromethyl group, etc., and the like.

Examples of the monomer that includes a fluorine atom in a side chain thereof include monomers in which an alicyclic olefin compound such as norbornene has a fluorine atom, a fluoroalkyl group or a derivative thereof as a side chain, ester compounds of acrylic acid or methacrylic acid with a fluoroalkyl group or a derivative thereof, olefins having a fluorine atom, a fluoroalkyl group or a derivative thereof as one or more types of side chain (a site excluding a double bond), and the like.

Examples of the monomer that includes a fluorine atom in the main chain and a side chain thereof include ester compounds of α-fluoroacrylic acid, β-fluoroacrylic acid, α,β-fluoroacrylic acid, α-trifluoromethylacrylic acid, β-trifluoromethylacrylic acid, α,β-trifluoromethylacrylic acid or the like with a fluoroalkyl group or a derivative thereof, monomers derived by substituting hydrogen atom(s) of one or more types of vinyl moieties by a fluorine atom or a trifluoromethyl group and substituting a side chain of the monomer with a fluorine atom, a fluoroalkyl group or a derivative thereof; alicyclic olefin compound monomers derived by substituting hydrogen atom(s) bonded to one or more types of double bonds by a fluorine atom or a trifluoromethyl group, etc., and having a fluorinated alkyl group or a derivative thereof as a side chain; and the like. The alicyclic olefin compound as referred to herein means a compound that includes a double bond in a part of its ring.

In regard to the mode of inclusion of the fluorine atoms in the polymer (d), the polymer (d) preferably includes a structural unit (IV) represented by the following formula (F1).

In the above formula (F1), $R^3$ represents a hydrogen atom, a fluorine atom, a methyl group or a trifluoromethyl group; $R^4$ represents a linear or branched alkyl group having 1 to 6 carbon atoms or a monovalent alicyclic hydrocarbon group having 4 to 20 carbon atoms or a derived group thereof, each having at least one fluorine atoms; k is an integer of 1 to 3, wherein in a case in which $R^4$ is present in a plurality of number, the plurality of $R^4$s may be the same or different; and A represents a single bond or a linking group having a valency of (k+1).

Examples of the linking group having a valency of (k+1) which may be represented by A include an oxygen atom, a sulfur atom, a carbonyloxy group, an oxycarbonyl group, an amide group, a sulfonylamide group, a urethane group, a carbonyloxy-di(oxycarbonyl)ethanediyl group, a carbonyloxy-di(oxycarbonyl)propanediyl group, a tri(carbonyloxy)ethanediyl group, a carbonyloxy-tri(oxycarbonyl)ethanediyl group, a carbonyloxy-tri(oxycarbonyl)propanediyl group, a tetra(carbonyloxy)ethanediyl group, and the like.

Examples of the monomer that gives a structural unit (IV) include (meth)acrylic acid trifluoromethyl ester, (meth)acrylic acid 2,2,2-trifluoroethyl ester, (meth)acrylic acid perfluoroethyl ester, (meth)acrylic acid perfluoro-n-propyl ester, (meth)acrylic acid perfluoro-i-propyl ester, (meth)acrylic acid perfluoro-n-butyl ester, (meth)acrylic acid perfluoro-i-butyl ester, (meth)acrylic acid perfluoro-t-butyl ester, (meth)acrylic acid 2-(1,1,1,3,3,3-hexafluoropropyl) ester, (meth)acrylic acid 1-(2,2,3,3,4,4,5,5-octafluoropentyl) ester, (meth)acrylic acid perfluorocyclohexylmethyl ester, (meth)acrylic acid 1-(2,2,3,3,3-pentafluoropropyl) ester, (meth)acrylic acid 1-(3,3,4,4,5,5,6,6,7,7,8,8,9,9,10,10,10-heptadecafluorodecyl) ester, (meth)acrylic acid 1-(5-trifluoromethyl-3,3,4,4,5,6,6,6-octafluorohexyl) ester, (meth)acrylic acid 2,2-di(2,2,2-trifluoroethyloxycarbonyl)ethyl ester, (meth)acrylic acid 2,2-di(2,2,2-trifluoroethyloxycarbonyl)ethyl ester, and the like. Of these, (meth)acrylic acid 2,2,2-trifluoroethyl ester and (meth)acrylic acid 2,2-di(2,2,2-trifluoroethyloxycarbonyl)ethyl ester are preferred, and (meth)acrylic acid 2,2,2-trifluoroethyl ester is more preferred.

The polymer (d) may include two or more types of the structural unit (IV). The lower limit of the proportion of the structural unit (IV) contained with respect to the total structural units in the polymer (d) is typically 5 mol %, preferably 10 mol %, and more preferably 15 mol %. When the proportion of the structural unit (IV) is less than 5 mol %, the receding contact angle of no less than 70° may not be achieved, and/or elution of the acid generating agent and the like from the resist film may not be suppressed.

In addition to the structural unit (IV), the polymer (d) may include in order to control rates of dissolution in developer solutions, at least one type of other structural unit such as: the structural unit (I) in the polymer (a) that includes an acid-labile group; the structural unit (II) in the polymer (a) that includes a lactone structure, a cyclic carbonate structure, a sultone structure or a combination thereof; and a structural unit that includes an alicyclic hydrocarbon group.

The structural unit that includes an alicyclic hydrocarbon group is exemplified by a structural unit represented by the following formula (F2), and the like.

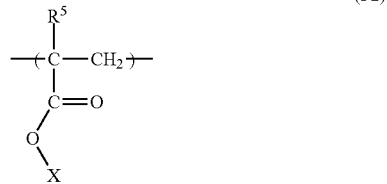

In the above formula (F2), $R^5$ represents a hydrogen atom, a fluorine atom, a methyl group or a trifluoromethyl group; and X represents a monovalent alicyclic hydrocarbon group having 4 to 20 carbon atoms.

The monovalent alicyclic hydrocarbon group having 4 to 20 carbon atoms represented by X is exemplified by hydrocarbon groups having an alicyclic ring derived from a cycloalkane such as cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, tricyclo[3.3.1.1$^{3,7}$]decane.

The upper limit of the proportion of the other structural unit contained with respect to the total structural units constituting the polymer (d) is typically 90 mol %, and preferably 80 mol %.

The lower limit of the content of the polymer (d) with respect to 100 parts by mass of the polymer (a) is preferably 0.1 parts by mass, and more preferably 1 part by mass. The upper limit of the content is preferably 20 parts by mass, and more preferably 10 parts by mass. When the content of the polymer (d) falls within the above range, water repellency of the surface of the resist film formed can be more adequately improved.

Synthesis Method of Polymer (d)

With respect to the synthesis method of the polymer (d), the polymer (d) may be synthesized according to, for example, a method similar to the synthesis method of the polymer (a). The lower limit of the Mw of the polymer (d) is preferably 1,000, and more preferably 2,000. The upper limit of the Mw is preferably 50,000, more preferably 30,000, and still more preferably 10,000. When the Mw of the polymer (d) is less than 1,000, it may be impossible to attain a sufficient advancing contact angle.

(e) Acid Diffusion Controller

The acid diffusion controller (e) exerts the effect of controlling a diffusion phenomenon of the acid generated from the acid generator (b) upon the exposure in the resist film, and suppressing unfavorable chemical reactions in unexposed regions. In addition, the acid diffusion controller (e) also exerts the effect of improving storage stability of the resist composition containing this component. The mode of incorporation of the acid diffusion controller (e) into the resist composition may be in a free compound form (hereinafter, may be also referred to as "(e) acid diffusion control agent" or "acid diffusion control agent (e)", as appropriate) or in an incorporated form as a part of the polymer, or in both of these forms.

The acid diffusion control agent (e) is exemplified by an amine compound, an amide group-containing compound, a urea compound, a nitrogen-containing heterocyclic compound, and the like.

Examples of the amine compound include: mono(cyclo)alkylamines; di(cyclo)alkylamines; tri(cyclo)alkylamines; substituted alkylanilines or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl) ether, bis(2-diethylaminoethyl) ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include N-t-butoxycarbonyl group-containing amino compounds such as N-(t-butoxycarbonyl)-4-hydroxypiperidine; N-t-pentyloxycarbonyl group-containing amino compounds such as N-(t-pentyloxycarbonyl)-4-hydroxypiperidine; formamide, N-methylformamide, NAN-dimethylformamide, acetamide, N-methylacetamide, NAN-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

As the acid diffusion control agent (e), a photodegradable base may be also used which is sensitized upon exposure to generate a weak acid. An example of the photodegradable base includes onium salt compounds, etc., which are degraded upon the exposure and lose their acid diffusion controllability. Examples of the onium salt compounds include sulfonium salt compounds represented by the following formula (K1), and iodonium salt compounds represented by the following formula (K2), and the like.

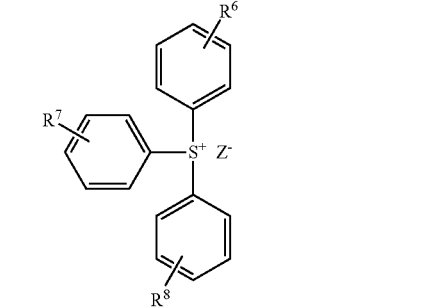

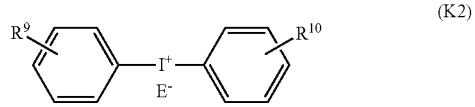

In the above formulae (K1) and (K2), $R^6$ to $R^{10}$ each independently represent a hydrogen atom, an alkyl group, an alkoxy group, a hydroxyl group or a halogen atom; $Z^-$ and $E^-$ are an anion represented by $OH^-$, $R^A$—$COO^-$, $R^A$—$SO_3^-$, $R^A$—$N^-$—$SO_2$—$R^B$ or the following formula (K3), wherein $R^A$ represents an alkyl group, an aryl group or an alkaryl group; and $R^B$ represents an alkyl group which may have a fluorine atom.

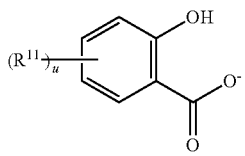

(K3)

In the above formula (K3), $R^{11}$ represents a linear or branched alkyl group having 1 to 12 carbon atoms, or a linear or branched alkoxyl group having 1 to 12 carbon atoms, wherein a part or all of hydrogen atoms included in the above alkyl group and alkoxyl group are not substituted or substituted by a fluorine atom; and u is an integer of 0 to 2.

Other Components

The resist composition may contain other component(s) except for the above components (a) to (e). Examples of the other component include a surfactant, a sensitizing agent, and the like.

Surfactant

The surfactant has the effect of improving coating properties, striation, developability and the like. The surfactant which may be employed is similar to any one for use in general resist materials.

Sensitizing Agent

The sensitizing agent exhibits the action of increasing the amount of the acid produced from the acid generator (b), and exerts the effect of improving "apparent sensitivity" of the resist composition.

Examples of the sensitizing agent include carbazoles, acetophenones, benzophenones, naphthalenes, phenols, biacetyls, eosins, rose bengals, pyrenes, anthracenes, phenothiazines, and the like. Two or more types of these sensitizing agents may be used in combination.

Preparation Method of Resist Composition

The resist composition may be prepared by, for example, mixing the polymer (a), the acid generator (b), the solvent (c) and favorable component(s) at a certain ratio. The lower limit of the solid content concentration of the resist composition is typically 0.1% by mass, and preferably 1% by mass. The upper limit of the solid content concentration is typically 50% by mass, and preferably 25% by mass.

The prepattern-forming step may involve, not only the process described above, for example, after the step of providing a resist film from the resist composition, and the step of exposing the resist film are carried out: a step of developing with an alkaline developer solution such as an aqueous tetramethylammonium hydroxide solution; and a step of overall-exposure of the resist film developed.

Next, a contacting step will be explained which may be carried out after the prepattern-forming step and before the resin layer-providing step.

Contacting Step

In this step, a composition (II) is brought into contact with at least a lateral face of the prepattern, the composition (II) containing a basic compound and an organic solvent, and not containing a polymer not substantially accompanied by a change in solubility in the organic solvent due to an action of an acid. According to the pattern-forming method, when the contacting step is involved, the shape of the pattern formed can be more favorable. It is considered that the improvement is attained because, for example, a basic compound is attached to the prepattern through bringing the composition (II) into contact with at least a lateral face of the prepattern, and thus some regions in adjacent portions formed in subsequent resin layer-providing step and insolubilizing step are generated, in which acidic groups such as a carboxy group constituting the adjacent portions are converted into anionic groups such as a carboxylate group by way of the basic compound, whereby the adjacent portions become more hardly soluble in the organic solvent used in the removing step.

The basic compound which may be contained in the composition (II) is not particularly limited as long as it is basic, and for example, compounds similar to those exemplified as the basic compound which may be contained in the composition (I) as described later, and the like may be included.

Examples of the organic solvent which may be contained in the composition (II) include organic solvents similar to those exemplified as the organic solvent in connection with the prepattern-forming step, and the like may be included.

The polymer which is not substantially accompanied by a change in solubility in the organic solvent due to an action of an acid, and which is not contained in the composition (II) is, for example, a polymer similar to those exemplified as the polymer (I) in the composition (I) as described later, and the like.

The composition (II) may contain other component(s) in addition to the basic compound and the organic solvent, and for example, a surfactant and the like may be contained.

The lower limit of the content of the basic compound in the composition (II) is preferably 0.01% by mass, more preferably 0.05% by mass, still more preferably 0.1% by mass, and particularly preferably 0.2% by mass. The upper limit of the content is preferably 10% by mass, more preferably 5% by mass, still more preferably 1% by mass, and particularly preferably 0.5% by mass.

The process of bringing the composition (II) into contact with at least a lateral face of the prepattern is, for example, spin coating, and the like.

Next, the step following the resin layer-providing step will be explained.

Resin Layer-Providing Step

Figure 1B:
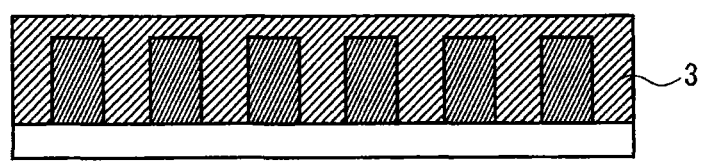

In this step, a resin layer is provided on at least a lateral face of the prepattern. This resin layer is formed from the composition (I) containing a polymer not substantially accompanied by a change in solubility in the organic solvent due to an action of an acid (I). The composition (I) is for use in microfabrication of a resist pattern, and is capable of thickening the prepattern formed beforehand, thereby leading to narrowing of the space portions of the pattern or decreasing the diameter of the pattern hole portions to allow for the microfabrication of the resist pattern. As shown in FIG. 1B, a resin layer 3 is formed on at least a lateral face of a prepattern 2 according to this step. This step can be carried out by, for example, coating the composition (I) through spin-coat or the like, followed by baking, and the like, similarly to the case of the resist film-providing step described above. This composition (I) is exemplified by a composition (I-A) and a composition (I-B).

Composition (I-A)

The composition (I-A) contains the polymer (I), and (p) an organic solvent, the polymer (I) having the Mw of no less than 15,000 and no greater than 150,000 (hereinafter, this polymer (I) may be also referred to as "polymer (I-A)"). According to the pattern-forming method, by using as the composition (I), the composition (I-A) containing the polymer (I-A) having the Mw falling within the above specified range, a fine pattern having a desired dimension can be formed. This advantage is presumed to result from, for example, a change of the adjacent portions formed in the insolubilizing step so as to be more hardly soluble in the organic solvent used in the removing step. The composition (I-A) may also contain other component(s) in addition to these components. Each component will be explained below.

Polymer (I-A)

The polymer (I-A) is not particularly limited as long as solubility in the organic solvent is not substantially changed due to an action of an acid, and for example, the polymer obtained by removing the structural unit that includes an acid-labile group from the (a') polymer exemplified in connection with the prepattern-forming step, and the like may be included.

The polymer (I-A) preferably has a structural unit (a) that includes a lactone structure, a cyclic carbonate structure, a sultone structure or a combination thereof, in light of the adjustment of solubility and insolubility of the resin layer formed according to the pattern-forming method. The structural unit (a) is exemplified by examples of the structural unit (II) in the polymer (a) described above, and the like. Of these, the structural unit (a) is preferably a structural unit that includes a monocyclic lactone structure, a structural unit that includes a polycyclic lactone structure, a structural unit that includes a monocyclic cyclic carbonate structure, and a structural unit that includes a polycyclic sultone structure. More preferably, the structural unit (a) is a structural unit derived from norbornanelactone-yl (meth)acrylate, a structural unit derived from norbornanelactone-yloxycarbonylmethyl (meth)acrylate, a structural unit derived from ethylene carbonate-ylmethyl (meth)acrylate, a structural unit derived from γ-butyrolactone-yl (meth)acrylate, and a structural unit derived from norbornanesulton-yl (meth)acrylate are more preferred.

The lower limit of the proportion of the structural unit (a) contained with respect to the total structural units constituting the polymer (I-A) is preferably 10 mol %, more preferably 15 mol %, and still more preferably 20 mol %. The upper limit of the proportion of the structural unit (a) is preferably 80 mol %, more preferably 60 mol %, and still more preferably 50 mol %. When the proportion of the structural unit (a) falls within the above range, a more favorable pattern can be formed according to the pattern-forming method.

In addition, it is preferred that the polymer (I-A) further has a structural unit (β) that includes a hydroxy group, a carboxy group, an oxo group or a combination thereof, in light of the adjustment of the solubility and insolubility of the resin layer formed according to the pattern-forming method. The structural unit (β) is exemplified by a structural unit that includes a hydroxy group, a carboxy group or an oxo group, and the like, among the examples of the structural unit (III) in the polymer (a) described above. Of these, the structural unit (β) is preferably a structural unit that includes a hydroxy group, more preferably a structural unit derived from (meth)acrylate that includes a hydroxy group and polycyclic cycloalkyl group, and still more preferably a structural unit derived from 3-hydroxyadamantan-1-yl (meth)acrylate.

When the polymer (I-A) has the structural unit (β), the lower limit of the proportion of the structural unit (β) contained with respect to the total structural units constituting the polymer (I-A) is preferably 10 mol %, and more preferably 15 mol %. The upper limit of the proportion of the structural unit (β) is preferably 50 mol %, and more preferably 30 mol %. When the proportion of the structural unit (β) contained falls within the above range, a more favorable pattern can be formed according to the pattern-forming method.

In addition, the polymer (I-A) preferably has a structural unit (γ) that includes an acid-nonlabile hydrocarbon group having 1 to 30 carbon atoms, in light of the adjustment of the solubility and insolubility of the resin layer formed. Examples of the monomer that gives the structural unit (γ) include:

methyl (meth)acrylate;

primary or secondary alkyl (meth)acrylate such as ethyl (meth)acrylate, n-propyl (meth)acrylate, i-propyl (meth)acrylate, n-butyl (meth)acrylate, i-butyl (meth)acrylate, sec-butyl (meth)acrylate, n-octyl (meth)acrylate and n-dodecyl (meth)acrylate;

secondary monocyclic or polycyclic cycloalkyl (meth)acrylate such as cyclopropyl (meth)acrylate, cyclobutyl (meth)acrylate, cyclopentyl (meth)acrylate, cyclohexyl (meth)acrylate, cyclooctyl (meth)acrylate, cyclodecyl (meth)acrylate, norbornan-2-yl (meth)acrylate, adamantan-2-yl (meth)acrylate, tricyclodecan-2-yl (meth)acrylate and tetracyclodecan-2-yl (meth)acrylate;

adamantan-1-yl (meth)acrylate;

aryl (meth)acrylate such as phenyl (meth)acrylate, tolyl (meth)acrylate, xylyl (meth)acrylate, mesityl (meth)acrylate, naphthyl (meth)acrylate and anthryl (meth)acrylate;

aralkyl (meth)acrylate such as benzyl (meth)acrylate, phenethyl (meth)acrylate, naphthylmethyl (meth)acrylate and anthrylmethyl (meth)acrylate;

styrene compounds such as styrene, methylstyrene, t-butoxystyrene and α-methylstyrene; and the like.

The structural unit (γ) is preferably a structural unit derived from (meth)acrylate that includes a linear hydrocarbon group, a structural unit derived from (meth)acrylate that includes an alicyclic hydrocarbon group and a structural unit derived from a styrene compound, more preferably a structural unit derived from methyl (meth)acrylate, a structural unit derived from primary alkyl (meth)acrylate, a structural unit derived from secondary cycloalkyl (meth)acrylate, a structural unit derived from adamantan-1-yl (meth)acrylate and a structural unit derived from a styrene compound, still more preferably a structural unit derived from methyl (meth)acrylate, a structural unit derived from n-butyl (meth)acrylate, a structural unit derived from n-decyl (meth)acrylate, a structural unit derived from cyclohexyl (meth)acrylate, a structural unit derived from adamantan-1-yl (meth)acrylate, a structural unit derived from tricyclodecan-2-yl (meth)acrylate, a structural unit derived from styrene and a structural unit derived from t-butoxystyrene, and particularly preferably a structural unit derived from methyl (meth)acrylate, a structural unit derived from cyclohexyl (meth)acrylate, a structural unit derived from adamantan-1-yl (meth)acrylate and a structural unit derived from styrene.

The lower limit of the proportion of the structural unit (γ) contained with respect to the total structural units constituting the polymer (I-A) is more preferably 10 mol %, still more preferably 30 mol %, and particularly preferably 50 mol %. The upper limit of the proportion of the structural unit (γ) is preferably 95 mol %, more preferably 90 mol %, and still more preferably 85 mol %. When the proportion of the structural unit (γ) contained falls within the above range, a more suitable amount of dimension reduction can be attained according to the pattern-forming method.

Among exemplary structural units (γ), a structural unit that includes a substituted or unsubstituted aromatic hydrocarbon group having 6 to 30 carbon atoms (hereinafter, may be also referred to as "structural unit (γ')") is preferred in light of further improvement of the etching resistance of the resist pattern.

Examples of the aromatic hydrocarbon group having 6 to 30 carbon atoms include:

aryl groups such as a phenyl group, a naphthyl group and an anthryl group;

aralkyl groups such as a benzyl group, a phenethyl group and a naphthylmethyl group; and the like.

Examples of the substituent of the aromatic hydrocarbon group include:

polar groups such as oxyhydrocarbon groups such as e.g., a hydroxy group, an amino group, a carboxy group, an acyl group, an acyloxy group, an alkoxy group, a cycloalkyloxy group and an aryloxy group, oxygen atom-containing groups such as e.g., a sulfonylhydrocarbon group and a nitro group, a cyano group, a sulfanyl group, etc.;

halogen atoms such as a fluorine atom, a chlorine atom, a bromine atom and an iodine atom; and the like.

Examples of the structural unit (γ') include:

structural units that derived from (meth)acrylate that includes an aromatic hydrocarbon group such as a structural unit derived from benzyl (meth)acrylate, a structural unit derived from phenyl (meth)acrylate, a structural unit derived from naphthyl (meth)acrylate a structural unit derived from naphthylmethyl (meth)acrylate, a structural unit derived from tolyl (meth)acrylate, a structural unit derived from xylyl (meth)acrylate, a structural unit derived from mesityl (meth)acrylate, a structural unit derived from anthryl (meth) acrylate, a structural unit derived from anthryl methyl (meth) acrylate and a structural unit derived from phenethyl (meth) acrylate;

structural units derived from a styrene compound such as a structural unit derived from styrene, a structural unit derived from methylstyrene, a structural unit derived from t-butoxystyrene and a structural unit derived from α-methylstyrene; and the like.

It is preferred that the oxygen atom-containing group as a substituent does not bond to the aromatic hydrocarbon group, and it is more preferred that the polar group does not bond thereto. Due to a failure in bonding of the aforementioned group to the aromatic hydrocarbon group, the etching resistance of the resist pattern can be further improved.

The polymer (I-A) may have other structural unit(s) in addition to the structural units (α) to (γ). The upper limit of the proportion of the other structural unit(s) contained with respect to the total structural units constituting the polymer (I-A) is typically, 20 mol %, and preferably 10 mol %.

The lower limit of the Mw of the polymer (I-A) is 15,000, more preferably 17,000, still more preferably 20,000, and particularly preferably 23,000. The upper limit of the Mw of the polymer (I-A) is 150,000, preferably 100,000, more preferably 80,000, still more preferably 50,000, and particularly preferably 30,000. When the Mw is less than 15,000, the shape of the pattern formed according to the pattern-forming method may be deteriorated. Whereas, when the Mw is greater than 150,000, preparation of the composition (I-A) may be difficult, and as a result of occurrence of a residual film in microfabrication, leading to a difficulty in forming the fine pattern.

(p) Organic Solvent

Examples of the organic solvent (p) contained in the composition (I-A) include organic solvents similar to those exemplified as the organic solvent for use in the prepattern-forming step, and the like.

The organic solvent (p) is preferably an ether solvent, a ketone solvent and an ester solvent, and more preferably a ketone solvent and an ester solvent. The ketone solvent is preferably an aliphatic ketone solvent, and more preferably 2-heptanone and cyclohexanone. The ester solvent is more preferably a mono ester solvent and a polyhydric alcohol mono ether acetate solvent, and particularly preferably butyl acetate and propylene glycol monomethyl ether acetate.

The lower limit of the percentage content of the organic solvent (p) with respect to the entire solvent contained in the composition (I-A) is preferably 25% by mass, more preferably 40% by mass, still more preferably 60% by mass, particularly preferably 80% by mass, and yet particularly preferably 95% by mass. The upper limit of the percentage content of is typically 100% by mass. When the percentage content of the organic solvent (p) falls within the above range, coating properties of the composition (I-A) onto the prepattern can be improved, and as a result, a fine resist pattern having a desired dimension can be more certainly formed and a dependency on the pattern type can be further reduced. The solvent other than the organic solvent (p) is exemplified by water, silicon oil, and the like.

Other Component

Other component which may be contained in the composition (I-A) is, for example a surfactant, and the like.

The composition (I-A) preferably attains at least one of the following features (i) and (ii):
(i) the polymer (I) having a basic group; and
(ii) the composition (I) further containing a basic compound (hereinafter, may be also referred to as "(q) basic compound" or "basic compound (q)").

The above features (i) and (ii) are identical to the features (i') and (ii') in connection with the composition (I-B) described later. When the composition (I-A) is basic due to the features (i) and (ii) above, a pattern having a more favorable shape can be formed according to the pattern-forming method.

Composition (I-B)

The composition (I-B) contains the polymer (I) and the organic solvent (p), and attains at least one of the following features (i') and (ii'):
(i') the polymer (I) having a basic group (in this instance, the polymer (I) may be also referred to as "polymer (I-B)" below).
(ii') the composition (I) further containing a basic compound.

Accordingly, the composition (I-B) contains the polymer (I) and the organic solvent (p), and is basic. According to the pattern-forming method, by using as the composition (I), the composition (I-B) that is basic, a fine pattern having a desired dimension can be formed. In addition, a pattern having a more favorable shape can be formed. This advantage is presumed to result from, for example, a change of the adjacent portions formed in the insolubilizing step so as to be more hardly soluble in the organic solvent used in the removing step because the acidic group such as a carboxy group of the polymer constituting the adjacent portion is converted into an ionic group such as a carboxylate group due to the basicity of the composition (I-B).

The lower limit of the Mw of the polymer (I) is not particularly limited, but is preferably 15,000. The upper limit of the Mw is preferably 150,000. When the Mw falls within the above range, a pattern having a more favorable shape can be formed according to the pattern-forming method.

Polymer (I-B)

The polymer (I-B) in the above feature (i') has a basic group, and is not substantially accompanied by a change in solubility in the organic solvent due to an action of an acid. The polymer (I-B) preferably has a basic group, and is not substantially accompanied by a change in solubility in the organic solvent due to an action of an acid (hereinafter, may be also referred to as "polymer (I'-B)").

The basic group is not particularly limited as long as it is basic, and for example, the group represented by following formula (a) (hereinafter, may be also referred to as "(a) group" or "group (a)"), the group represented by following formula (b) (hereinafter, may be also referred to as "(b) group" or "group (b)"), and the like may be included.

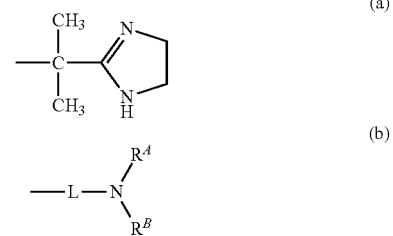

In the above formula (b), L represents a single bond, a divalent linear hydrocarbon group having 1 to 20 carbon atoms, or a divalent alicyclic hydrocarbon group having 3 to 20 carbon atoms; and $R^A$ and $R^B$ each independently represent a hydrogen atom, a monovalent linear hydrocarbon group having 1 to 20 carbon atoms, or a monovalent alicyclic hydrocarbon group having 3 to 20 carbon atoms, or L and $R^A$ optionally taken together represent an aliphatic heterocyclic structure having 3 to 20 ring atoms together with the nitrogen atom to which L and $R^A$ bond.

Examples of the divalent linear hydrocarbon group having 1 to 20 carbon atoms which may be represented by L include:

alkanediyl groups such as a methanediyl group, an ethanediyl group and a propanediyl group;

alkenediyl groups such as an ethenediyl group, a propenediyl group and a butenediyl group;

alkynediyl groups such as an ethynediyl group, a propynediyl group and a butynediyl group; and the like.

Examples of the divalent alicyclic hydrocarbon group having 3 to 20 carbon atoms which may be represented by L include:

cycloalkanediyl groups such as a cyclopropanediyl group, a cyclobutanediyl group, a cyclopentanediyl group, a cyclohexanediyl group, a cyclooctanediyl group, a cyclodecanediyl group, a norbornanediyl group and an adamantanediyl group;

cycloalkenediyl groups such as a cyclopropenediyl group, a cyclopentenediyl group, a cyclohexenediyl group and a norbornenediyl group; and the like.

The monovalent linear hydrocarbon group having 1 to 20 carbon atoms and the monovalent alicyclic hydrocarbon group having 3 to 20 carbon atoms which may be represented by $R^A$ and $R^B$ may include, for example, groups obtained by adding one hydrogen atom to the above-exemplified divalent groups which may be represented by L, and the like.

$R^A$ and $R^B$ described above represent preferably a hydrogen atom or a monovalent linear hydrocarbon group, more preferably a hydrogen atom or an alkyl group, and still more preferably a hydrogen atom or a methyl group.

Examples of the aliphatic heterocyclic structure having 3 to 20 ring atoms optionally taken together represented by L and $R^A$ together with the nitrogen atom to which L and $R^A$ bond include an azacyclopropane structure, an azacyclobutane structure, an azacyclopentane structure, an azacyclohexane structure, an azacyclooctane structure, an azanorbornane structure, and the like.

Examples of the group (b) include an amino group, an aminomethyl group, a methylamino group, a methylaminomethyl group, a dimethylamino group, a dimethylaminomethyl group, a diethylamino group, a diethylaminopropyl group, a pyrrolidin-1-yl group, a pyrrolidin-1-ylmethyl group, a piperidin-1-yl group, a piperidin-1-ylethyl group, a 1,2,2,6,6-pentamethylpiperidin-4-yl group, and the like.

A binding site of the group (a) and the group (b) in the polymer (I-B) is not particularly limited, and the group (a) and the group (b) may bond at any of the main chain, a side chain, an end and two or more of these.

It is preferred that the group (a) bonds to an end of the polymer (I-B). In the case where the group (a) bonds to the end, the effect resulting from the presence of the basic group tends to be enhanced, and thus the effects by way of the pattern-forming method can be achieved while the amount of the introduction of the group (a) into the polymer (I-B) is decreased. Moreover, the group (a) can be conveniently introduced into the end of the polymer (I-B) through carrying out the polymerization by using a radical polymerization initiator having this group (a).

In regard to the group (b), it is preferred that polymer (I-B) has a structural unit that includes this group. The structural unit that includes the group (b) is exemplified by a structural unit that includes the group (b) and is derived from a (meth)acryloyl compound, a structural unit that includes the group (b) and is derived from a styrene compound, and the like. The structural unit that includes the group (b) is preferably a structural unit that includes a piperidine structure, more preferably a structural unit that includes a piperidine structure and is derived from (meth) acrylate, and still more preferably a structural unit derived from 1,2,2,6,6-pentamethylpiperidin-4-yl (meth)acrylate.

The lower limit of the proportion of the structural unit that includes the group (b) contained with respect to the total structural units constituting the polymer (I-B) is preferably 1 mol %, more preferably 10 mol %, still more preferably 30 mol %, and particularly preferably 50 mol %. The upper limit of the proportion of the structural unit that includes the group (b) with respect to the total structural units constituting the polymer (I-B) is preferably 90 mol %, more preferably 80 mol %, still more preferably 70 mol %, and even more preferably 65 mol %. When the proportion of the structural unit that includes the group (b) contained falls within the above range, the shape of the resultant pattern can be more favorable.

(p) Organic Solvent

Examples of the organic solvent (p) contained in the composition (I-B) include organic solvents similar to those exemplified as the organic solvent (p) contained in the composition (I-A), and the like. Also, in regard to the organic solvent (p) of the composition (I-B), preferred types and the preferred range of the percentage content of the organic solvent (p) with respect to the entire solvent contained in the composition (I-B) are similar to those in the case of the organic solvent (p) in the composition (I-A).

(q) Basic Compound

The basic compound (q) is not particularly limited as long as it is a basic compound, and a compound represented by the following formula (X) (hereinafter, may be also referred to as "compound (1)") and at least of a compound represented by the following formula (Y) (hereinafter, may be also referred to as "compound (2)") is preferred.

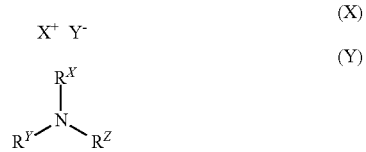

In the above formula (X), $X^+$ represents a monovalent onium cation; $Y^-$ represents a monovalent carboxylate anion or a monovalent sulfonamide anion.

In the above formula (Y), $R^X$ represents an unsubstituted or hydroxy-substituted monovalent linear hydrocarbon group having 1 to 20 carbon atoms, or an unsubstituted or hydroxy-substituted monovalent alicyclic hydrocarbon group having 3 to 20 carbon atoms; $R^Y$ and $R^Z$ represent an unsubstituted or hydroxy-substituted monovalent linear hydrocarbon group having 1 to 20 carbon atoms, or an unsubstituted or hydroxy-substituted monovalent alicyclic hydrocarbon group having 3 to 20 carbon atoms, or these groups taken together represent an aliphatic heterocyclic structure having 3 to 20 ring atoms together with the nitrogen atom to which $R^Y$ and $R^Z$ bond.

Examples of the monovalent onium cation represented by $X^+$ include a sulfonium cation, an iodonium cation, an ammonium cation, an oxonium cation, and the like.

Examples of the monovalent carboxylate anion which may be represented by $Y^-$ include a salicylate anion, and the like.

Examples of the monovalent sulfonamide anion which may be represented by $Y^-$ include a trifluoromethylsulfonamide ion, and the like.

Examples of the monovalent linear hydrocarbon group having 1 to 20 carbon atoms and monovalent alicyclic hydrocarbon group having 3 to 20 carbon atoms which may represented by $R^X$, $R^Y$ and $R^Z$, respectively, include groups similar to those exemplified as $R^{p1}$, $R^{p2}$ and $R^{p3}$ in the above formula (i), and the like.

Examples of the aliphatic heterocyclic structure having 3 to 20 ring atoms taken together represented by $R^Y$ and $R^Z$ together with the nitrogen atom to which $R^Y$ and $R^Z$ bond include:

azacycloalkane structures such as an azacyclopropane structure, an azacyclobutane structure, an azacyclopentane structure, an azacyclohexane structure, an azacyclooctane structure, an azacyclodecane structure, an azanorbornane structure and an azaadamantane structure;

azaoxacycloalkane structures such as an azaoxacyclopentane structure, an azaoxacyclohexane structure, an azaoxacyclooctane structure and an azaoxanorbornane structure;

diazacycloalkane structures such as a diazacyclopentane structure, a diazacyclohexane structure, a diazacyclooctane structure, a diazacyclodecane structure and a diazanorbornane structure; and the like.

Examples of the compound (1) include triphenylsulfonium salicylate, triphenylsulfonium n-butyltrifluoromethylsulfonamide, and the like.

Examples of the compound (2) include tri-n-pentylamine, tri-n-octylamine, 4-hydroxy-1,2,2,6,6-pentamethylpiperidine, and the like.

The lower limit of the content of the basic compound (q) with respect to 100 parts by mass of the polymer (I) is preferably 0.1 parts by mass, more preferably 0.5 parts by mass, still more preferably 1 part by mass, and particularly preferably 3 parts by mass. The upper limit of the content of the basic compound (q) with respect to 100 parts by mass of the polymer (I) is preferably 30 parts by mass, more preferably 20 parts by mass, still more preferably 15 parts by mass, and particularly preferably 12 parts by mass. When the content of the basic compound (q) falls within the above range, the shape of the resultant pattern can be more favorable.

In the case where the polymer constituting the prepattern has an acid-labile group, the basic group and the basic compound described above preferably have a basicity greater than the basicity of a conjugated base of the acidic group generated upon dissociation of the acid-labile group. When the basic group and the basic compound having the above property are used, a pattern having an even more favorable shape can be formed according to the pattern-forming method.

Insolubilizing Step

Figure 1C:
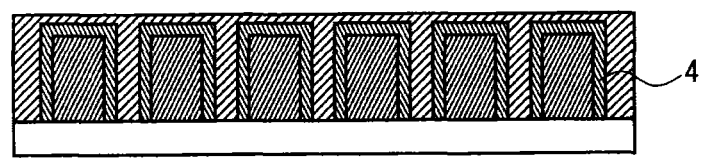

In this step, the prepattern and the resin layer are heated to make adjacent portions of the resin layer to the prepattern insoluble or hardly soluble in the organic solvent, without being accompanied by an increase of a molecular weight. According to this step, as shown in FIG. 1C, in regions of the resin layer 3 adjacent to the prepattern 2, adjacent portions 4 that are insoluble or hardly soluble in the organic solvent are formed. The expression "without being accompanied by an increase of a molecular weight" means that due to, for example, the absence of generation of a new covalent bond between the polymer constituting the prepattern and the polymer constituting the resin layer, the molecular weight of each of these polymers is not substantially increased. In this step, it is considered that heating of the prepattern 2 and the resin layer 3 causes intermixing between, for example, the polymer constituting the prepattern 2 and the polymer constituting the adjacent portion 4 of the resin layer 3, whereby the polymer present in the adjacent portion 4 becomes insoluble or hardly soluble in the organic solvent.

In regard to the heating process, for example, a hot plate, an oven or the may be used. The lower limit of the heating temperature is typically 50° C., preferably 60° C., more preferably 100° C., and still more preferably 120° C. The upper limit of the temperature is typically 300° C., preferably 260° C., more preferably 250° C., still more preferably 240° C., and particularly preferably 200° C. The lower limit of the time period of the heating is preferably 10 sec, more preferably 20 sec, and still more preferably 30 sec. The upper limit of the time period of the heating is preferably 10 min, more preferably 5 min, and still more preferably 3 min. With regard to the atmosphere of the heating, the heating may be carried out in any of the air, and an inert gas such as nitrogen and argon.

Removing Step

Figure 1D:
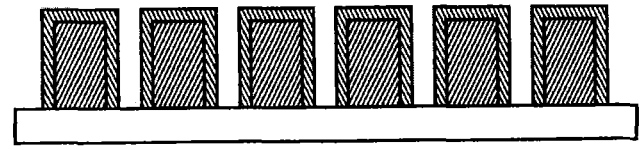

In this step, a portion of the resin layer 3 except for the adjacent portion 4 made insoluble or hardly soluble is removed with the organic solvent. Accordingly, a microfabricated pattern can be obtained as shown in FIG. 1D. The process for executing this step may include, for example, a process of carrying out a treatment with an organic solvent, similarly to the development process of the resist film described above such as e.g., dip-coating process, puddling process, spray-coating process, dynamic dispensing process, etc., and the like.

The organic solvent for use in the removing is not particularly limited as long as the organic solvent does not dissolve the prepattern 2 and the adjacent portion 4, and dissolves portions of the resin layer 3 except for the adjacent portion 4 made insoluble or hardly soluble as describe above. For example, one, or two or more types of the organic solvents exemplified above in connection with the prepattern-forming step may be employed, or the organic solvent that is the same as the organic solvent contained in the composition (I) may be used.

Rinsing Step

In this step, rinsing is carried out using an organic solvent that is different from the organic solvent used in the removing step.

The organic solvent used in this step is not particularly limited as long as it is different from the organic solvent employed in the removing step, and for example, one, or two or more types of the organic solvents exemplified in connection with the prepattern may be used. Among these organic solvents, in light of making the shape of the resultant pattern more favorable, an organic solvent that is less polar than the organic solvent used in the removing step is preferably employed.

According to the pattern-forming method, through carrying out the steps described in the foregoing, a fine resist pattern having a desired dimension can be conveniently formed.

Resist Pattern-Microfabricating Composition

The resist pattern-microfabricating composition may be in one of the following modes (A) and (B):

composition (A): containing a polymer that includes a basic group and is not substantially accompanied by a change in solubility in an organic solvent due to an action of an acid; and composition (B): containing a polymer not substantially accompanied by a change in solubility in an organic solvent due to an action of an acid, and a basic compound.

In the composition (A) and the composition (B), the Mw of the polymer contained is preferably no less than 15,000 and no greater than 150,000.

In regard to the resist pattern-microfabricating composition, the composition (A) and the composition (B) have been explained in terms of the composition (I-B) for use in the pattern-forming method.

EXAMPLES

Hereinafter, the present invention is explained in detail by way of Examples, but the present invention is not in any way limited by Examples.

Synthesis of Polymer

The polymer (a) and the polymer (d) for use in preparing the resist composition, and a monomer compound and a polymerization initiator used in the synthesis of the polymer (I) for use in preparing the resist pattern-microfabricating composition are shown below.
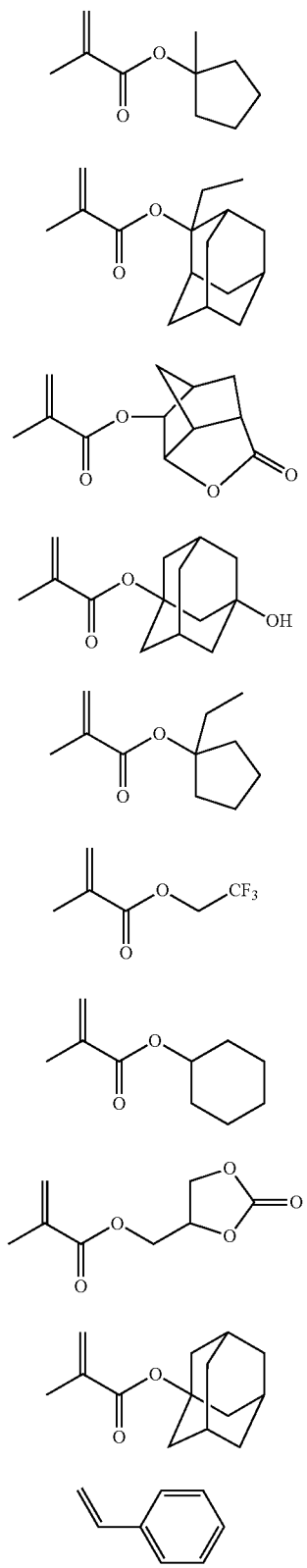
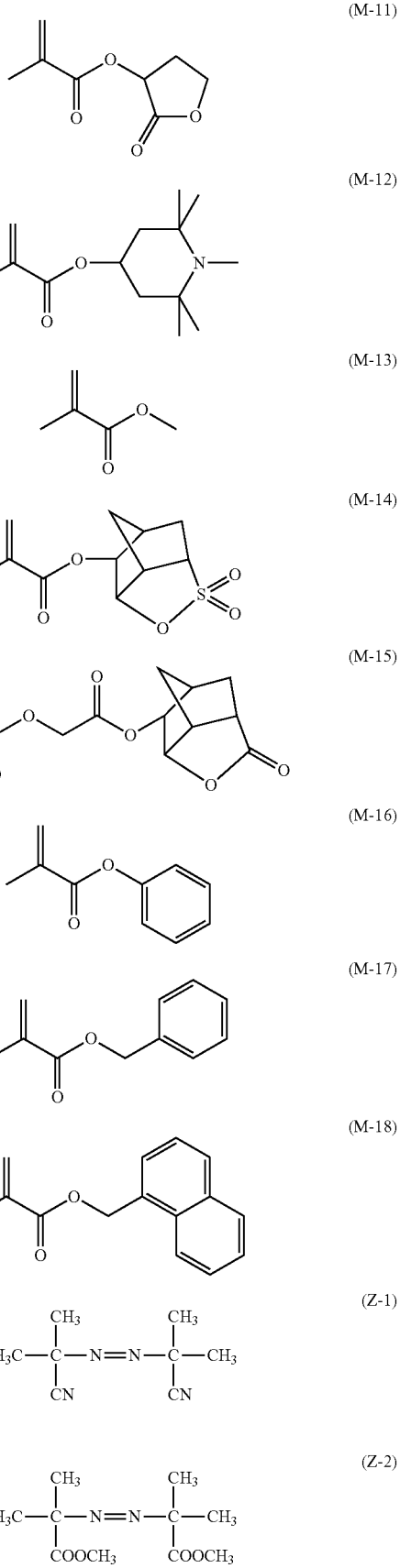

-continued

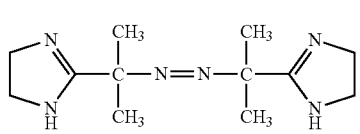

(Z-3)

Synthesis of Polymer (a)

Synthesis Example 1: Synthesis of Polymer (A-1)

A monomer solution was prepared by dissolving the compound (M-1) at 40 mol %, the compound (M-2) at 10 mol %, the compound (M-3) at 40 mol %, the compound (M-4) at 10 mol % and as a polymerization initiator, the compound (Z-1) at 5 mol % in 60 g of methyl ethyl ketone. It is to be noted that the mol % of each monomer compound is a proportion with respect to the total monomer compounds, and the mol % of the polymerization initiator is the proportion with respect to the total number of moles of the total monomer compounds and the polymerization initiator. In addition, the total mass of the monomer compound was adjusted so as to be 30 g. Then, 30 g of methyl ethyl ketone was charged into a 500 mL three-neck flask equipped with a thermometer and a dropping funnel, and purging with a nitrogen gas was carried out for 30 min. Thereafter, the content in the flask was heated to 80° C. while stirring with a magnetic stirrer. Next, the monomer solution prepared as described above was added dropwise to the three-neck flask using a dropping funnel over 3 hours. The time of the start of the dropwise addition was regarded as the time of the start of the polymerization reaction, and the polymerization reaction was allowed to proceed for 6 hours. Thereafter, the polymerization reaction liquid was cooled to 30° C. or below and then charged into 600 g of methanol, and a precipitated white powder was filtered off. The filtered white powder was washed twice with each 120 g of methanol to give a slurry form, which was washed and then filtered, and thereafter dried at 50° C. for 17 hours to give a white powdery polymer (A-1) (mass: 15.6 g; yield: 78%). The polymer (A-1) had an Mw of 6,200 and an Mw/Mn of 1.62. The result of $^{13}$C-NMR analysis indicated that the proportions of the structural unit derived from (M-1), the structural unit derived from (M-2), the structural unit derived from (M-3) and the structural unit derived from (M-4) contained in the polymer (A-1) were 40.2 mol %, 9.0 mol %, 41.1 mol % and 9.7 mol %, respectively.

Synthesis of Polymer (d)

Synthesis Example 2: Synthesis of Polymer (D-1)

A monomer solution was prepared by dissolving the compound (M-5) at 70 mol %, the compound (M-6) at 30 mol % and as a polymerization initiator, the compound (Z-2) at 8 mol % in 100 g of methyl ethyl ketone. It is to be noted that the mol % of each monomer compound is a proportion with respect to the total monomer compounds, and the mol % of the polymerization initiator is the proportion with respect to the total number of moles of the total monomer compounds and the polymerization initiator. In addition, the total mass of the monomer compound was adjusted so as to be 50 g. Subsequently, 100 g of methyl ethyl ketone was charged into a 500 mL three-neck flask, which was then purged with a nitrogen gas for 30 min. Thereafter, the mixture was heated to 80° C. while stirring, and the monomer solution prepared above was added dropwise over 3 hours with a dropping funnel. The time of the start of the dropwise addition was regarded as the time of the start of the polymerization reaction, and the polymerization reaction was allowed to proceed for 6 hours. After completing the polymerization reaction, the polymerization reaction solution was water-cooled to 30° C. or below, and then washes with 825 g of a mixed solution of methanol/methyl ethyl ketone/hexane=2/1/8 (mass ratio). Then the solvent was substituted with propylene glycol monomethyl ether acetate to obtain a solution containing a polymer (D-1), with the amount of the polymer obtained of 38.0 g (yield: 76.0%). The polymer (D-1) had an Mw of 7,000, and an Mw/Mn of 1.40. The result of $^{13}$C-NMR analysis indicated that the proportions of the structural unit derived from (M-5) and the structural unit derived from (M-6) contained in the polymer (D-1) were 70.2 mol % and 29.8 mol %, respectively.

TABLE 1

| | Polymer | Monomer that gives structural unit (I) | | | Monomer that gives structural units (II) to (IV) | | | Polymerization initiator | | Yield (%) | Mw | Mw/Mn |
| | | type | amount (mol %) | proportion of the structural unit (mol %) | type | amount (mol %) | proportion of the structural unit (mol %) | type | amount (mol %) | | | |
| --- | --- | --- | --- | --- | --- | --- | --- | --- | --- | --- | --- | --- |
| Synthesis Example 1 | A-1 | M-1 | 40 | 40.2 | M-3 | 40 | 41.1 | Z-1 | 5 | 77.6 | 6,200 | 1.62 |
| | | M-2 | 10 | 9.0 | M-4 | 10 | 9.7 | | | | | |
| Synthesis Example 2 | D-1 | M-5 | 70 | 70.2 | M-6 | 30 | 29.8 | Z-2 | 8 | 76.0 | 7,000 | 1.40 |

Synthesis of Polymer (I)

Synthesis Examples 3 to 13: Synthesis of Polymers (I-1) to (I-7) and (I-9) to (I-12)

Polymers (I-1) to (I-7) and (I-9) to (I-12) were each synthesized in a similar manner to Synthesis Example 1 except that the monomer compound and the polymerization initiator of the type and the amount shown in Table 2 below were used. The Mw, the Mw/Mn and the yield of each polymer, and the proportion of each structural unit contained in each polymer are shown together in Table 2. It is to be noted that "-" in Table 2 denotes that any corresponding monomer compound was not used.

TABLE 2

| | (I) Polymer | Monomer that gives structural unit (α) | | | Monomer that gives structural unit (β) | | | Monomer that gives structural unit (γ) | | |
|---|---|---|---|---|---|---|---|---|---|---|
| | | type | amount (mol %) | proportion of the structural unit (mol %) | type | amount (mol %) | proportion of the structural unit (mol %) | type | amount (mol %) | proportion of the structural unit (mol %) |
| Synthesis Example 3 | I-1 | M-8 | 30 | 27.2 | — | — | — | M-7 | 70 | 72.8 |
| Synthesis Example 4 | I-2 | M-3 | 20 | 20.9 | — | — | — | M-9 | 80 | 79.1 |
| Synthesis Example 5 | I-3 | M-11 | 40 | 42.5 | — | — | — | M-10 | 60 | 57.5 |
| Synthesis Example 6 | I-4 | M-14 | 30 | 28.0 | — | — | — | M-13 | 10 | 11.5 |
| Synthesis Example 7 | I-5 | M-15 | 25 | 23.8 | M-4 | 15 | 14.6 | M-7 | 60 | 61.6 |
| Synthesis Example 8 | I-6 | M-15 | 25 | 24.0 | M-4 | 15 | 14.5 | M-7 | 60 | 61.5 |
| Synthesis Example 9 | I-7 | M-15 | 25 | 23.2 | M-4 | 15 | 13.9 | M-7 | 60 | 62.9 |
| Synthesis Example 10 | I-9 | M-3 | 20 | 18.8 | — | — | — | M-16 | 80 | 81.2 |
| Synthesis Example 11 | I-10 | M-8 | 40 | 40.6 | — | — | — | M-17 | 60 | 59.4 |
| Synthesis Example 12 | I-11 | M-8 | 20 | 20.9 | — | — | — | M-17 | 80 | 79.1 |
| Synthesis Example 13 | I-12 | M-11 | 30 | 29.2 | — | — | — | M-18 | 50 | 52.1 |

| | Monomer that gives structural unit that includes a basic group | | | Polymerization initiator | | Yield (%) | Mw | Mw/Mn |
|---|---|---|---|---|---|---|---|---|
| | type | amount (mol %) | proportion of the structural unit (mol %) | type | amount (mol %) | | | |
| Synthesis Example 3 | — | — | — | Z-1 | 1.5 | 82.0 | 22,000 | 2.33 |
| Synthesis Example 4 | — | — | — | Z-1 | 2 | 80.8 | 16,000 | 2.05 |
| Synthesis Example 5 | — | — | — | Z-3 | 2 | 71.3 | 19,000 | 2.39 |
| Synthesis Example 6 | M-12 | 60 | 60.5 | Z-1 | 0.5 | 80.5 | 46,000 | 2.22 |
| Synthesis Example 7 | — | — | — | Z-1 | 2 | 81.1 | 19,000 | 2.53 |
| Synthesis Example 8 | — | — | — | Z-1 | 3.5 | 80.2 | 12,000 | 2.40 |
| Synthesis Example 9 | — | — | — | Z-1 | 0.1 | 72.2 | 158,000 | 2.57 |
| Synthesis Example 10 | — | — | — | Z-2 | 1 | 75.9 | 31,000 | 2.30 |
| Synthesis Example 11 | — | — | — | Z-1 | 1.5 | 79.0 | 23,000 | 2.09 |
| Synthesis Example 12 | — | — | — | Z-1 | 1.5 | 80.2 | 23,000 | 2.00 |
| Synthesis Example 13 | M-12 | 20 | 18.7 | Z-1 | 1 | 73.1 | 33,000 | 2.45 |

Preparation of Resist Composition

The acid generating agent (b), the solvent (c) and acid diffusion control agent (e) other than the polymer (a) and the polymer (d) used in preparation of the resist composition are shown below.

(b) Acid Generating Agent

B-1: triphenylsulfonium 1,1-difluoro-2-((3-hydroxyadamantan-1-yl)methoxy)-2-oxoethanesulfonate (compound represented by the following formula (B-1))

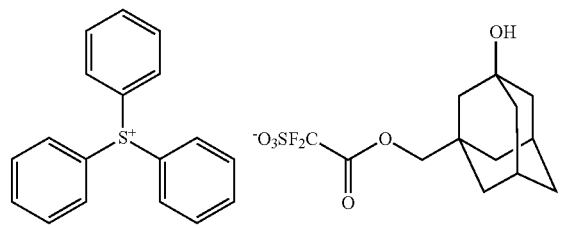

(B-1)

(c) Solvent

C-1: propylene glycol monomethyl ether acetate
C-2: cyclohexanone
C-3: γ-butyrolactone (e) Acid Diffusion Control Agent E-1: tert-pentyl 4-hydroxypiperidine-1-carboxylate (compound represented by the following formula (E-1))

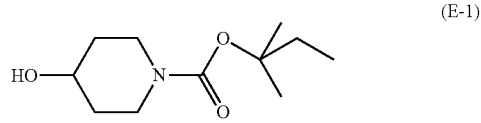

(E-1)

Preparation Example 1: Preparation of Resist Composition (J-1)

A resist composition (J-1) was prepared through mixing: 100 parts by mass of the polymer (A-1) as the polymer (a); 7.8 parts by mass of the acid generating agent (B-1) as the acid generating agent (b); 2,510 parts by mass of the solvent (C-1), 1,075 parts by mass of the solvent (C-2) and 30 parts by mass of the solvent (C-3) as the solvent (c); 3 parts by mass of the polymer (D-1) as the polymer (d); and 0.8 parts by mass of the acid diffusion control agent (E-1) as the acid diffusion control agent (e).

TABLE 3

| Resist composition | (a) Polymer type | (a) Polymer amount (parts by mass) | (b) Acid generating agent type | (b) Acid generating agent amount (parts by mass) | (c) Solvent type | (c) Solvent amount (parts by mass) | (d) Polymer type | (d) Polymer amount (parts by mass) | (e) Acid diffusion control agent type | (e) Acid diffusion control agent amount (parts by mass) |
|---|---|---|---|---|---|---|---|---|---|---|
| Preparation Example 1 | J-1 | A-1 | 100 | B-1 | 7.8 | C-1/C-2/C-3 | 2,510/1,075/30 | D-1 | 3 | E-1 | 0.8 |

Preparation of Resist Pattern-Microfabricating Composition

The basic compound (q) and the solvent (p) other than the polymer (I) used in preparing the resist pattern-microfabricating composition are shown below.

(q) Basic Compound

Q-1: triphenylsulfonium salicylate (compound represented by the following formula (Q-1))

Q-2: triphenylsulfonium camphorsulfonate (compound represented by the following formula (Q-2))

Q-3: trioctylamine (compound represented by the following formula (Q-3))

Q-4: 4-hydroxy-1,2,2,6,6-pentamethylpiperidine (compound represented by the following formula (Q-4))

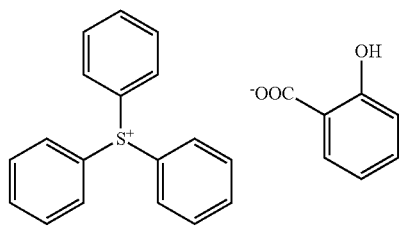

(Q-1)

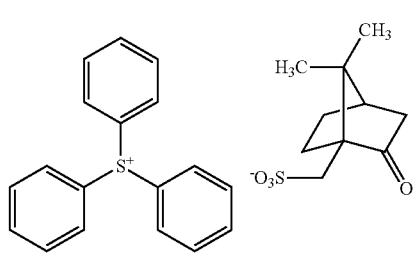

(Q-2)

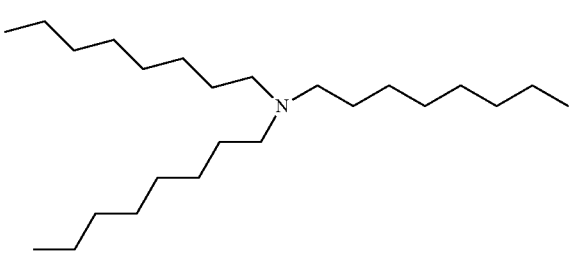

(Q-3)

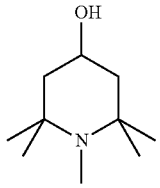

(Q-4)

(p) Solvent

P-1: propylene glycol monomethyl ether acetate
P-2: cyclohexanone
P-3: butyl acetate (nBA)
P-4: 2-heptanone (MAK)

Example 1: Preparation of Resist Pattern-Microfabricating Composition (S-1)

A resist pattern-microfabricating composition (S-1) was prepared through mixing: 100 parts by mass of the polymer (I-1) as the polymer (I); 8 parts by mass of the compound (Q-1) as the basic compound (q); and 2,084 parts by mass of the solvent (P-1) and 894 parts by mass of the solvent (P-2) as the solvent (p).

Examples 2 to 12 and Preparation Examples 2 and 3: Preparation of Resist Pattern-Microfabricating Compositions (S-2) to (S-10) and (S-12) to (S-15)

Pattern-microfabricating compositions (S-2) to (S-10) and (S-12) to (S-15) were each prepared in a similar manner to Example 1 except that each component of the type and the amount shown in Table 4 below was used. Note that as the polymer (I-8), a novolak resin "EP4020G" (m-cresol:p-cresol=60:40 (molar ratio); Mw: 12,000) available from Asahi Organic Chemicals Industry Co., Ltd. was used.

TABLE 4

| | Resist pattern-microfabricating composition | (I) Polymer type | (I) Polymer amount (parts by mass) | (q) Basic compound type | (q) Basic compound amount (parts by mass) | (p) Solvent type | (p) Solvent amount (parts by mass) |
|---|---|---|---|---|---|---|---|
| Example 1 | S-1 | I-1 | 100 | Q-1 | 8 | P-1/P-2 | 2,084/894 |
| Example 2 | S-2 | I-2 | 100 | Q-2 | 8 | P-1/P-2 | 2,084/894 |
| Example 3 | S-3 | I-2 | 100 | Q-3 | 5 | P-1 | 2,228 |
| Example 4 | S-4 | I-3 | 100 | — | — | P-3 | 4,900 |
| Example 5 | S-5 | I-4 | 100 | — | — | P-4 | 4,900 |
| Example 6 | S-6 | I-5 | 100 | — | — | P-3 | 3,604 |
| Example 7 | S-7 | I-6 | 100 | Q-1 | 8 | P-3 | 3,892 |
| Preparation Example 2 | S-8 | I-6 | 100 | — | — | P-3 | 3,604 |
| Preparation Example 3 | S-9 | I-7 | 100 | — | — | P-3 | 3,604 |
| Example 8 | S-10 | I-8 | 100 | Q-4 | 10 | P-3 | 5,390 |
| Example 9 | S-12 | I-9 | 100 | Q-1 | 8 | P-1/P-2 | 2,084/894 |
| Example 10 | S-13 | I-10 | 100 | Q-1 | 8 | P-1/P-2 | 2,084/894 |
| Example 11 | S-14 | I-11 | 100 | Q-1 | 8 | P-1/P-2 | 2,084/894 |
| Example 12 | S-15 | I-12 | 100 | — | — | P-3 | 3,604 |

Pattern Formation

Example 13: Formation of Prepattern

An underlayer antireflective film having a film thickness of 105 nm was provided on a 12-inch silicon wafer by spin-coating an antireflective film-forming agent ("ARC66" available from Nissan Chemical Industries, Ltd.) using a coater/developer ("CLEAN TRACK Lithius Pro i" available from Tokyo Electron Limited), followed by baking at 205° C. for 60 sec. On the substrate having this underlayer antireflective film provided thereon, the resist composition (J-1) prepared as described above was spin-coated using a coater/developer ("CLEAN TRACK ACT12" available from Tokyo Electron Limited), followed by soft baking (SB) at 80° C. for 60 sec. Thereafter, cooling at 23° C. for 30 sec provided a resist film having a film thickness of 70 nm.

Next, reduced projection exposure was carried out through a hole pattern mask, by using ArF Immersion Scanner ("NSR-S610C" available from Nikon Precision Equipment Company) under optical conditions involving a numerical aperture (NA) of 1.3 and cloth pole such that a pattern with 50 nm hole/125 nm pitch, and a pattern with 50 nm hole/1,000 nm pitch can be formed. After the exposure, post exposure baking (PEB) was carried out on a hot plate of the "CLEAN TRACK Lithius Pro i" at 95° C. for 60 sec, followed by cooling at 23° C. for 30 sec.

Then, using n-butyl acetate as a developer solution, a puddle development was carried out for 25 sec, and subsequently, a rinse treatment was carried out using 4-methyl-2-pentanol as a rinse agent for 7 sec. Thereafter, spin-drying by spinning off the solution at 2,000 rpm for 15 sec gave prepatterns with 50 nm hole/125 nm pitch and 50 nm hole/1,000 nm pitch.

Pattern-Narrowing

A resin layer was provided on the surface of the prepattern using a coater/developer ("CLEAN TRACK ACT12" available from Tokyo Electron Limited) by spin coating the pattern-microfabricating composition (S-1), heating at 180° C. for 60 sec, and then cooling at 23° C. for 30 sec.

Subsequently, a treatment of removing portions other than the adjacent portion by a puddling process for 25 sec by using n-butyl acetate as the organic solvent, and subsequently, a rinse treatment was carried out using 4-methyl-2-pentanol (MIBC) as a rinse agent for 7 sec. Thereafter, spin-drying was carried out by spinning off the solution at 2,000 rpm for 15 sec.

Examples 14 to 21 and 23 to 26, and Comparative Examples 1 and 2

Patterns were formed in a similar manner to Example 13 except that the resist pattern-microfabricating composition employed, and the temperature and the time period of the heating were as shown in Table 5 below. In Table 5, "-" denotes that the contacting step was not carried out.

Example 22

Contacting Step

On the prepattern obtained in a similar manner to Example 13, a 0.3% by mass MIBC solution (G-4) as the basic compound (q) was spin-coated using the aforementioned "CLEAN TRACK ACT12".

Pattern-Narrowing

A pattern was formed by subjecting the prepattern after executing the contacting step to an operation similar to that of Example 13 except that the composition (S-6) was used as the resist pattern-microfabricating composition.

Comparative Example 3

Pattern-Narrowing

On the prepattern obtained in a similar manner to Example 13, a composition (S-11, a crosslinking layer-forming material (B5) disclosed in Example 10 of Japanese Patent No. 4,558,064) prepared by mixing 3 parts by mass of a poly-p-hydroxystyrene resin (5.5 parts by mass of "VP8000" available from Nippon Soda Co., Ltd., and a hexamethoxymethylmelamine resin ("Cymel 300" available from Kyoeisha Chemical Co., Ltd.) and 190 parts by mass of 1-butanol was spin-coated using the aforementioned "CLEAN TRACK ACT12" and heated at 155° C. for 90 sec, followed by cooling at 23° C. for 30 sec. Next, a puddling process was carried out using the aforementioned "CLEAN TRACK Lithius Pro i" with an aqueous 2.38% by mass TMAH solution for 60 sec, and subsequently a rinse treatment was carried out using ultra pure water as a rinse agent, followed by additional baking at 90° C. for 90 sec, whereby a pattern was formed.

Comparative Example 4

Pattern-Narrowing

On the prepattern obtained in a similar manner to Example 13, a composition (S-16, a composition for fine pattern formation disclosed in Example 1 of Japanese Unexamined Patent Application, Publication No. 2013-83818) containing 5% by mass polyvinylimidazole (Mw: 20,000), 0.05% by mass surfactant and 94.95% by mass pure water was spin-coated using the aforementioned "CLEAN TRACK ACT12", and baked at 120° C. for 60 sec, followed by cooling at 23° C. for 30 sec. Next, washing was carried out using the aforementioned "CLEAN TRACK Lithius Pro i" with ultra pure water, whereby a pattern was formed.

Evaluations

With respect to the patterns obtained above, the amount of dimension reduction of a hole pattern, and the dependency on the pattern type were evaluated according to the following method. The results of the evaluations obtained are shown together in Table 5 below.

Amount of Dimension Reduction

The hole patterns with 125 nm pitch and 1,000 nm pitch formed above were observed using a scanning electron microscope ("CG4000" available from Hitachi High-Technologies Corporation), and the hole size of the prepattern, and the hole size of the prepattern after executing the pattern-narrowing step were measured. The difference between these measurements was calculated, and this difference was defined as the "amount of dimension reduction (nm)".

Dependency on the Pattern Type

In the evaluation of the amount of dimension reduction, the difference between the amount of dimension reduction with respect to the hole with 125 nm pitch, and the amount of dimension reduction with respect to the hole with 1,000 nm pitch was defined as the "dependency on the pattern type (nm)". The dependency on the pattern type was evaluated to be: "favorable" when the difference was less than 5 nm; and "unfavorable" when the difference was no less than 5 nm.

Etching Resistance

The etching rate of the film formed from each resist pattern-microfabricating composition was determined using a dry etching apparatus ("Telius SCCM" available from Tokyo Electron Limited), and evaluated by comparing with the etching rate of the film formed from the resist composition used for the prepattern, as: "A" when the etching rate was smaller; "B" when the etching rate was equivalent; and "C" when the etching rate was greater.

TABLE 5

| | Resist pattern-microfabricating composition | Baking temperature temperature (° C.) | time period (sec) | Contacting step | Amount of dimension reduction (nm) 125 nm pitch | 1,000 nm pitch | Dependency on the pattern type | Etching resistance |
|---|---|---|---|---|---|---|---|---|
| Example 13 | S-1 | 180 | 60 | — | 22 | 20 | favorable | B |
| Example 14 | S-2 | 190 | 60 | — | 10 | 8 | favorable | B |
| Example 15 | S-1 | 260 | 60 | — | 9 | 7 | favorable | B |
| Example 16 | S-3 | 150 | 60 | — | 23 | 21 | favorable | B |
| Example 17 | S-4 | 110 | 60 | — | 11 | 12 | favorable | A |
| Example 18 | S-5 | 220 | 60 | — | 15 | 17 | favorable | B |
| Example 19 | S-10 | 130 | 60 | — | 10 | 10 | favorable | B |
| Example 20 | S-6 | 170 | 60 | — | 16 | 15 | favorable | B |
| Example 21 | S-7 | 170 | 60 | — | 18 | 16 | favorable | B |
| Example 22 | S-6 | 180 | 60 | 0.3% by mass basic compound (Q-4) solution in MIBC | 19 | 19 | favorable | B |
| Example 23 | S-12 | 160 | 60 | — | 18 | 17 | favorable | A |
| Example 24 | S-13 | 160 | 60 | — | 24 | 22 | favorable | A |
| Example 25 | S-14 | 160 | 60 | — | 20 | 18 | favorable | A |
| Example 26 | S-15 | 160 | 60 | — | 20 | 19 | favorable | A |
| Comparative Example 1 | S-8 | 170 | 60 | — | 4 | 4 | favorable | B |
| Comparative Example 2 | S-9 | 170 | 60 | — | undetermined due to the residual film | | | |
| Comparative Example 3 | S-11 | 155 / 90 | 90 / 90 | | 9 | 28 | unfavorable | B |
| Comparative Example 4 | S-16 | 120 | 60 | — | 10 | 17 | unfavorable | B |

As is clear from the results shown in Table 5, dependency on the pattern type of the amount of dimension reduction is small according to the pattern-forming method of Examples, and therefore, the method can be suitably used also in pattern formation of a layout in which mixed various patterns are included, contrary to a conventional pattern-forming method illustrated in Comparative Example 3. In addition, as compared with the case of Comparative Example 1 in which the polymer (I) contained in the pattern-microfabricating composition has a low molecular weight, a greater amount of dimension reduction can be obtained according to the pattern-forming method of Examples. This indicates that the method is applicable to a prepattern having a comparatively great pattern with a favorable process window, in the case where a fine pattern is to be finally obtained, and has an advantage in securing a favorable process window also after pattern-narrowing. Since the dimension of the prepattern is restricted by the pitch, a pattern-microfabricating composition accompanied by a too great amount of dimension reduction may not be applicable in some cases, but according to the pattern-forming method of Examples, a suitable amount of dimension reduction of 5 to 25 nm can be attained even in the case where applied to a fine pitch. On the other hand, when the polymer (I) has a high molecular weight as in Comparative Example 2, a residual film is found in the step of removing the pattern-microfabricating composition with the organic solvent used in the pattern-narrowing, which may result from a low solubility of the polymer (I) in the organic solvent, leading to unfavorable removal. Furthermore, the pattern-forming method of Examples does not require a baking step after the development, as in the conventional pattern-forming method illustrated in Comparative Example 3, and a low dependency on the pattern type, and an amount of dimension reduction suited for fine pattern formation can be attained through a very convenient process. In addition, when the polymer in the resist pattern-microfabricating composition has a structural unit that includes an aromatic hydrocarbon group, etching resistance of the pattern can be improved.

According to the pattern-forming method and the resist pattern-microfabricating composition of the embodiments of the present invention, a resist pattern having a fine and favorable shape can be formed in a convenient manner. Therefore, these can be suitably used for pattern formation in the field of semiconductor processing in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
forming a prepattern that is insoluble or hardly soluble in an organic solvent;
providing a resin layer on at least an entirety of a lateral face of the prepattern;
heating the prepattern and the resin layer such that a portion of the resin layer adjacent to and in contact with the entirety of the lateral face of the prepattern is made insoluble or hardly soluble in the organic solvent, without being accompanied by an increase of a molecular weight of the portion of the resin layer; and
removing with the organic solvent, a portion of the resin layer other than the portion of the resin layer such that a resist pattern is obtained,
wherein the resin layer is formed from a first composition comprising: a first polymer; and an organic solvent, solubility of the first polymer in the organic solvent not substantially changing due to an action of an acid,
wherein the first polymer comprises a first structural unit that comprises a lactone structure, a cyclic carbonate structure, a sultone structure or a combination thereof, and
wherein a weight average molecular weight of the first polymer is no less than 15,000 and no greater than 150,000.

2. The pattern-forming method according to claim 1, wherein (i) the first polymer comprises a basic group; (ii) the first composition further comprises a basic compound; or both of (i) and (ii).

3. The pattern-forming method according to claim 1, wherein a heating temperature in the heating is no less than 60° C. and no greater than 250° C.

4. The pattern-forming method according to claim 1, wherein the forming of the prepattern comprises:
forming a resist film made from a resist composition comprising: a second polymer; a radiation-sensitive acid generator; and a solvent, wherein solubility of the second polymer in the organic solvent is capable of decreasing due to an action of an acid;
exposing the resist film; and
developing the exposed resist film with a developer solution comprising the organic solvent.

5. The pattern-forming method according to claim 4, wherein the second polymer comprises an acid-labile group.

6. The pattern-forming method according to claim 2, wherein the basic group is a group represented by formula (a), a group represented by formula (b), or both thereof:

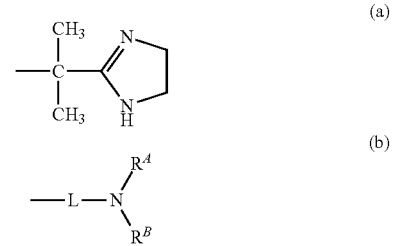

wherein, in the formula (b), L represents a single bond, a divalent linear hydrocarbon group having 1 to 20 carbon atoms, or a divalent alicyclic hydrocarbon group having 3 to 20 carbon atoms; and $R^A$ and $R^B$ each independently represent a hydrogen atom, a monovalent linear hydrocarbon group having 1 to 20 carbon atoms, or a monovalent alicyclic hydrocarbon group having 3 to 20 carbon atoms, or L and $R^A$ optionally taken together represent an aliphatic heterocyclic structure having 3 to 20 ring atoms together with the nitrogen atom to which L and $R^A$ bond.

7. The pattern-forming method according to claim 1, further comprising after forming the prepattern and before providing the resin layer,
bringing a second composition into contact with the at least an entirety of the lateral face of the prepattern, wherein the second composition comprises a basic compound and an organic solvent, and does not comprise a polymer solubility of which in the organic solvent does not substantially change due to an action of an acid.

8. The pattern-forming method according to claim 2, wherein the basic compound is a compound represented by formula (X), a compound represented by formula (Y), or both thereof:

wherein,
in the formula (X), $X^+$ represents a monovalent onium cation; and $Y^-$ represents a monovalent carboxylate anion or a monovalent sulfonamide anion, and
in the formula (Y), $R^X$ represents an unsubstituted or hydroxy-substituted monovalent linear hydrocarbon group having 1 to 20 carbon atoms, or an unsubstituted or hydroxy-substituted monovalent alicyclic hydrocarbon group having 3 to 20 carbon atoms; $R^Y$ and $R^Z$ each represent an unsubstituted or hydroxy-substituted monovalent linear hydrocarbon group having 1 to 20 carbon atoms, or an unsubstituted or hydroxy-substituted monovalent alicyclic hydrocarbon group having 3 to 20 carbon atoms, or $R^Y$ and $R^Z$ taken together represent an aliphatic heterocyclic structure having 3 to 20 ring atoms together with the nitrogen atom to which $R^Y$ and $R^Z$ bond.

9. The pattern-forming method according to claim 1, wherein a proportion of the first structural unit contained with respect to total structural units constituting the first polymer is no less than 10 mol % and no greater than 80 mol %.

10. The pattern-forming method according to claim 1, wherein the first polymer further comprises a second structural unit which comprises a hydroxy group, a carboxy group, an oxo group or a combination thereof.

11. The pattern-forming method according to claim 1, wherein the first polymer comprises a third structural unit which comprises a substituted or unsubstituted aromatic hydrocarbon group having 6 to 30 carbon atoms.

12. The pattern-forming method according to claim 1, wherein the prepattern is a line-and-space pattern or a hole pattern.

13. The pattern-forming method according to claim 1, further comprising after removing the portion of the resin layer, rinsing the resist pattern with an organic solvent that is other than the organic solvent used in removing the portion of the resin layer.

14. A pattern-forming method comprising:
forming a prepattern that is insoluble or hardly soluble in an organic solvent;
providing a resin layer on at least an entirety of a lateral face of the prepattern;
heating the prepattern and the resin layer such that a portion of the resin layer adjacent to and in contact with the entirety of the lateral face of the prepattern is made insoluble or hardly soluble in the organic solvent, without being accompanied by an increase of a molecular weight of the portion of the resin layer; and
removing with the organic solvent, a portion of the resin layer other than the portion of the resin layer such that a resist pattern is obtained,
wherein the resin layer is formed from a first composition comprising: a first polymer; and an organic solvent, solubility of the first polymer in the organic solvent not substantially changing due to an action of an acid,
wherein the first polymer comprises a first structural unit that comprises a lactone structure, a cyclic carbonate structure, a sultone structure or a combination thereof, and
wherein (i) the first polymer comprises a basic group; (ii) the first composition further comprises a basic compound; or both of (i) and (ii).

15. The pattern-forming method according to claim 14, wherein a heating temperature in the heating is no less than 60° C. and no greater than 250° C.

16. The pattern-forming method according to claim 14, wherein the forming of the prepattern comprises:
forming a resist film made from a resist composition comprising: a second polymer; a radiation-sensitive acid generator; and a solvent, wherein solubility of the second polymer in the organic solvent is capable of decreasing due to an action of an acid;
exposing the resist film; and
developing the exposed resist film with a developer solution comprising the organic solvent.

17. The pattern-forming method according to claim 16, wherein the second polymer comprises an acid-labile group.

18. The pattern-forming method according to claim 14, wherein the basic group is a group represented by formula (a), and a group represented by formula (b), or both thereof:

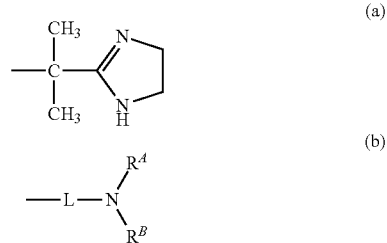

wherein, in the formula (b), L represents a single bond, a divalent linear hydrocarbon group having 1 to 20 carbon atoms, or a divalent alicyclic hydrocarbon group having 3 to 20 carbon atoms; and $R^A$ and $R^B$ each independently represent a hydrogen atom, a monovalent linear hydrocarbon group having 1 to 20 carbon atoms, or a monovalent alicyclic hydrocarbon group having 3 to 20 carbon atoms, or L and $R^A$ optionally taken together represent an aliphatic heterocyclic structure having 3 to 20 ring atoms together with the nitrogen atom to which L and $R^A$ bond.

19. The pattern-forming method according to claim 14, further comprising after forming the prepattern and before providing the resin layer,
bringing a second composition into contact with the at least an entirety of the lateral face of the prepattern, wherein the second composition comprises a basic compound and organic solvent, and does not comprise a polymer solubility of which in the organic solvent does not substantially change due to an action of an acid.

20. The pattern-forming method according to claim 14, wherein the basic compound is a compound represented by formula (X), a compound represented by formula (Y), or both thereof:

wherein,
in the formula (X), $X^+$ represents a monovalent onium cation; and $Y^-$ represents a monovalent carboxylate anion or a monovalent sulfonamide anion, and
in the formula (Y), $R^X$ represents an unsubstituted or hydroxy-substituted monovalent linear hydrocarbon group having 1 to 20 carbon atoms, or an unsubstituted or hydroxy-substituted monovalent alicyclic hydrocarbon group having 3 to 20 carbon atoms; $R^Y$ and $R^Z$ each represent an unsubstituted or hydroxy-substituted monovalent linear hydrocarbon group having 1 to 20 carbon atoms, or an unsubstituted or hydroxy-substituted monovalent alicyclic hydrocarbon group having 3 to 20 carbon atoms, or $R^Y$ and $R^Z$ taken together represent an aliphatic heterocyclic structure having 3 to 20 ring atoms together with the nitrogen atom to which $R^Y$ and $R^Z$ bond.

21. The pattern-forming method according to claim 14, wherein a proportion of the first structural unit contained with respect to total structural units constituting the first polymer is no less than 10 mol % and no greater than 80 mol %.

22. The pattern-forming method according to claim 14, wherein the first polymer further comprises a second structural unit which comprises a hydroxy group, a carboxy group, an oxo group or a combination thereof.

23. The pattern-forming method according to claim 14, wherein the first polymer comprises a third structural unit which comprises a substituted or unsubstituted aromatic hydrocarbon group having 6 to 30 carbon atoms.

24. The pattern-forming method according to claim 14, wherein the prepattern is a line-and-space pattern or a hole pattern.

25. The pattern-forming method according to claim 14, further comprising after removing the portion of the resin layer, rinsing the resist pattern with an organic solvent that is other than the organic solvent used in removing the portion of the resin layer.

\* \* \* \* \*